(12) United States Patent
Chen et al.

(10) Patent No.: US 12,557,364 B2
(45) Date of Patent: Feb. 17, 2026

(54) SEMICONDUCTOR DEVICE WITH GATE ISOLATION STRUCTURE

(71) Applicant: TAIWAN SEMICONDUCTOR MANUFACTURING COMPANY, LTD., Hsinchu (TW)

(72) Inventors: Ting-Gang Chen, Taipei (TW); Wan Chen Hsieh, Hsinchu (TW); Bo-Cyuan Lu, New Taipei (TW); Tai-Jung Kuo, Hsinchu (TW); Kuo-Shuo Huang, Taipei (TW); Chi-Yen Tung, Changhua County (TW); Tai-Chun Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 390 days.

(21) Appl. No.: 18/189,708

(22) Filed: Mar. 24, 2023

(65) Prior Publication Data
US 2024/0145249 A1    May 2, 2024

Related U.S. Application Data

(60) Provisional application No. 63/381,294, filed on Oct. 28, 2022.

(51) Int. Cl.
*H01L 21/28* (2025.01)
*H10D 84/01* (2025.01)
*H10D 84/03* (2025.01)
*H10D 84/85* (2025.01)

(52) U.S. Cl.
CPC ..... *H01L 21/28123* (2013.01); *H10D 84/017* (2025.01); *H10D 84/0172* (2025.01); *H10D 84/0188* (2025.01); *H10D 84/0193* (2025.01); *H10D 84/038* (2025.01); *H10D 84/853* (2025.01)

(58) Field of Classification Search
CPC ............ H10D 84/017; H10D 84/0172; H10D 84/0188; H10D 84/0193; H10D 84/853; H10D 84/0151; H10D 84/0158; H10D 84/834
See application file for complete search history.

(56) References Cited

U.S. PATENT DOCUMENTS

2020/0105613 A1\*  4/2020  Hung ................... H10D 30/608
2023/0070925 A1\*  3/2023  Min .................... H01L 21/0259

\* cited by examiner

*Primary Examiner* — Fernando L Toledo
*Assistant Examiner* — Adam S Bowen
(74) *Attorney, Agent, or Firm* — Birch, Stewart, Kolasch & Birch, LLP

(57) ABSTRACT

A device includes first and second gate structures respectively extending across the first and second fins, and a gate isolation plug between a longitudinal end of the first gate structure and a longitudinal end of the second gate structure. The gate isolation plug comprises a first dielectric layer and a second dielectric layer over the first dielectric layer. The first dielectric layer has an upper portion and a lower portion below the upper portion. The upper portion has a thickness smaller than a thickness of the lower portion of the first dielectric layer.

20 Claims, 37 Drawing Sheets

SEMICONDUCTOR DEVICE WITH GATE ISOLATION STRUCTURE

PRIORITY CLAIM AND CROSS-REFERENCE

This application claims priority to U.S. Provisional Application Ser. No. 63/381,294, filed Oct. 28, 2022, which is herein incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
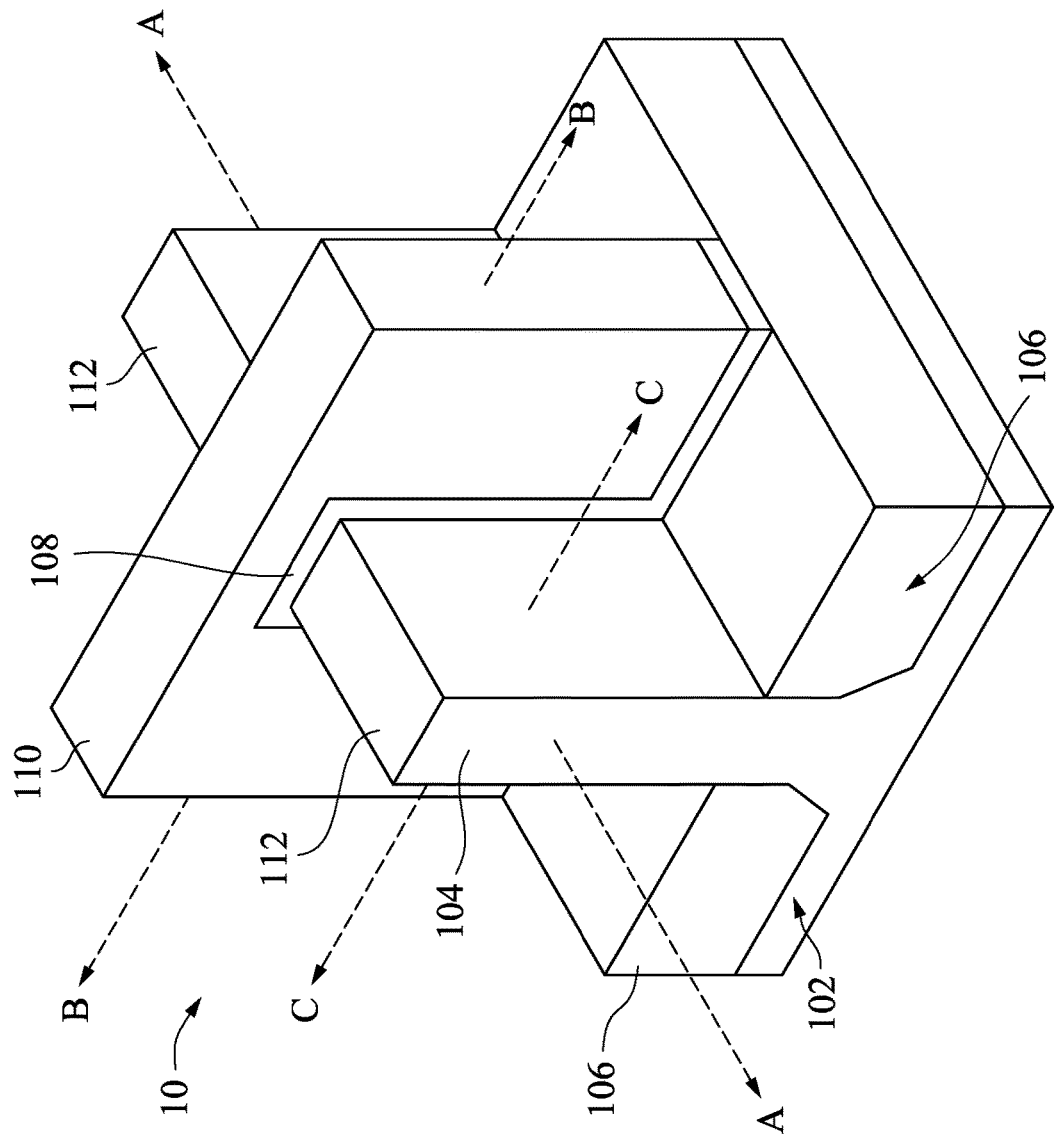
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar numeral in different figures refers to the same or similar element formed by a same or similar formation method using a same or similar material(s). In addition, figures with the same numeral but different alphabets (e.g., FIGS. 6A and 6B) illustrate different views (e.g., cross-sectional views along different cross-sections) of the same device at a same stage of fabrication.

Fin Field-Effect Transistor (FinFET) devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

Embodiments of the present disclosure are discussed in the context of forming a multi-layered insulating film stack as a gap filling dielectric structure. Although the disclosed embodiments are discussed in front-end-of-line (FEOL) processing of Fin Field-Effect Transistor (FinFET) devices as examples, principles of the disclosed embodiments may be used in other types of devices (e.g., planar devices) and/or in other manufacturing stages, such as back-end-of-line (BEOL) processing.

In some embodiments, an isolation plug is formed to fill a gap or an opening, such as an opening that separates two metal gates in a metal gate cutting process. The isolation plug includes a first dielectric layer (e.g., SiN) lining sidewalls and a bottom of the opening, and a second dielectric layer (e.g., $SiO_2$) filling up the remaining opening. The first dielectric layer is non-conformal, and in particular the first dielectric layer is thinner at the upper portion of the opening than at the lower portion of the opening. Such profile provides an improved deposition window for depositing the second dielectric layer into the remaining opening, which in turn prevents unfilled gaps or voids in the second dielectric layer, which in turn improves electrical isolation property for the isolation plug.

FIG. 1 illustrates an example of a FinFET 10 in a perspective view. The FinFET 10 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate electrode 110 is over the gate dielectric 108. Source/drain regions 112 are in the fin 104 and on opposing sides of the gate dielectric 108 and the gate electrode 110. FIG. 1 further illustrates reference cross-sections that are used in later figures. Cross-section B-B extends along a longitudinal axis of the gate electrode 110 of the FinFET 10. Cross-section A-A is perpendicular to cross-section B-B and is along a longitudinal axis of the fin 104 and in a direction of, for example, a current flow between the source/drain regions 112. Cross-section C-C is parallel to cross-section B-B and is across the source/drain region 112. Subsequent figures refer to these reference cross-sections for clarity.

Figure 2:
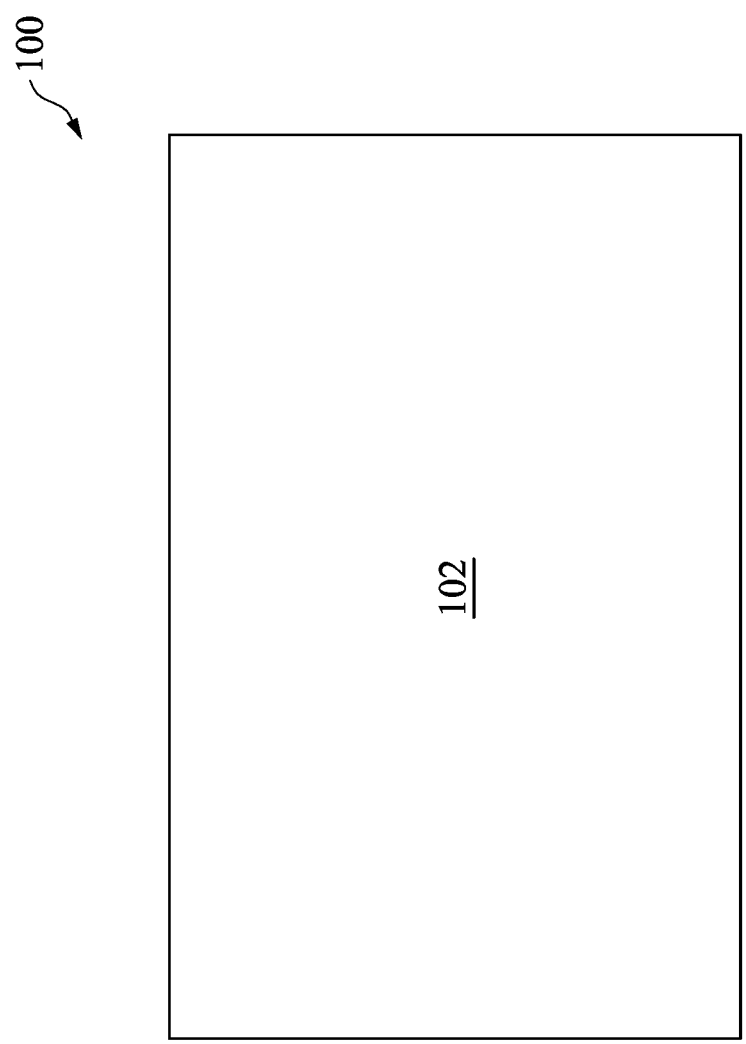
FIGS. 2-4 illustrate cross-sectional views of the FinFET device along cross-section B-B of FIG. 1, in accordance with some embodiments.
Figure 3:
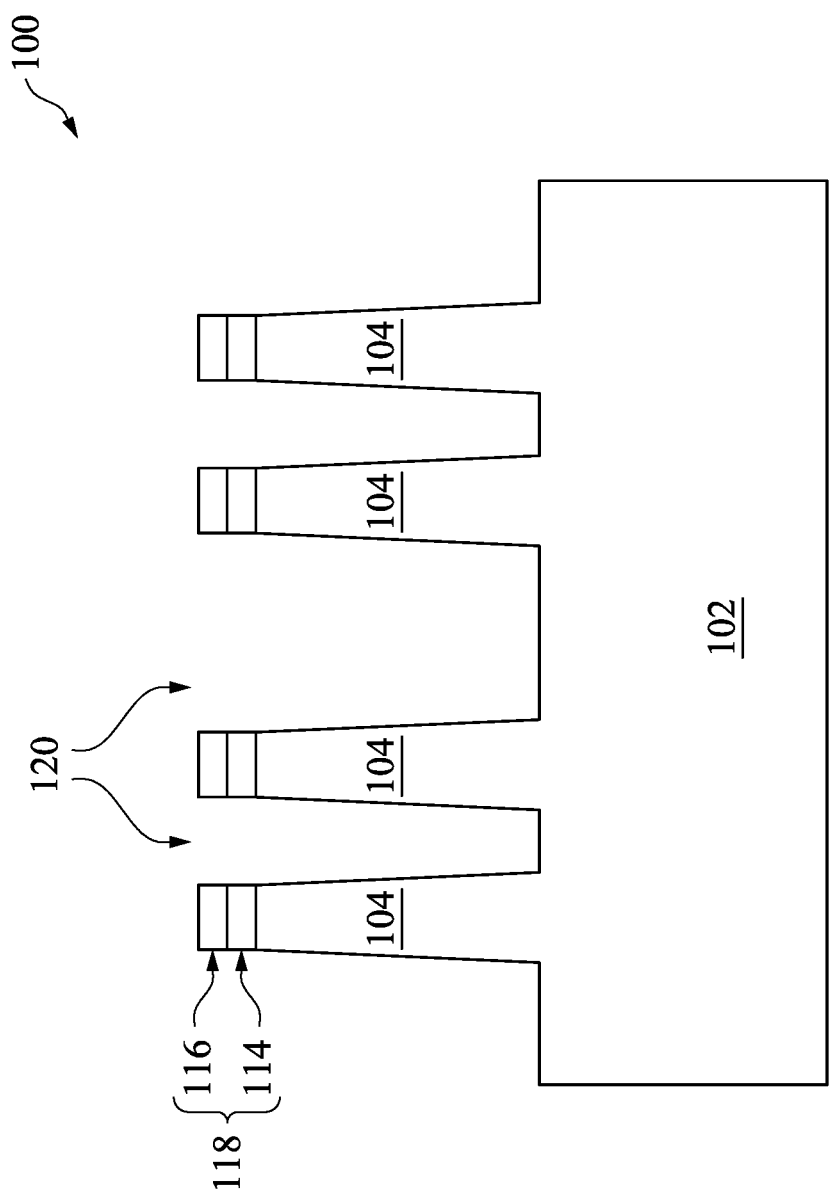
Figure 4:
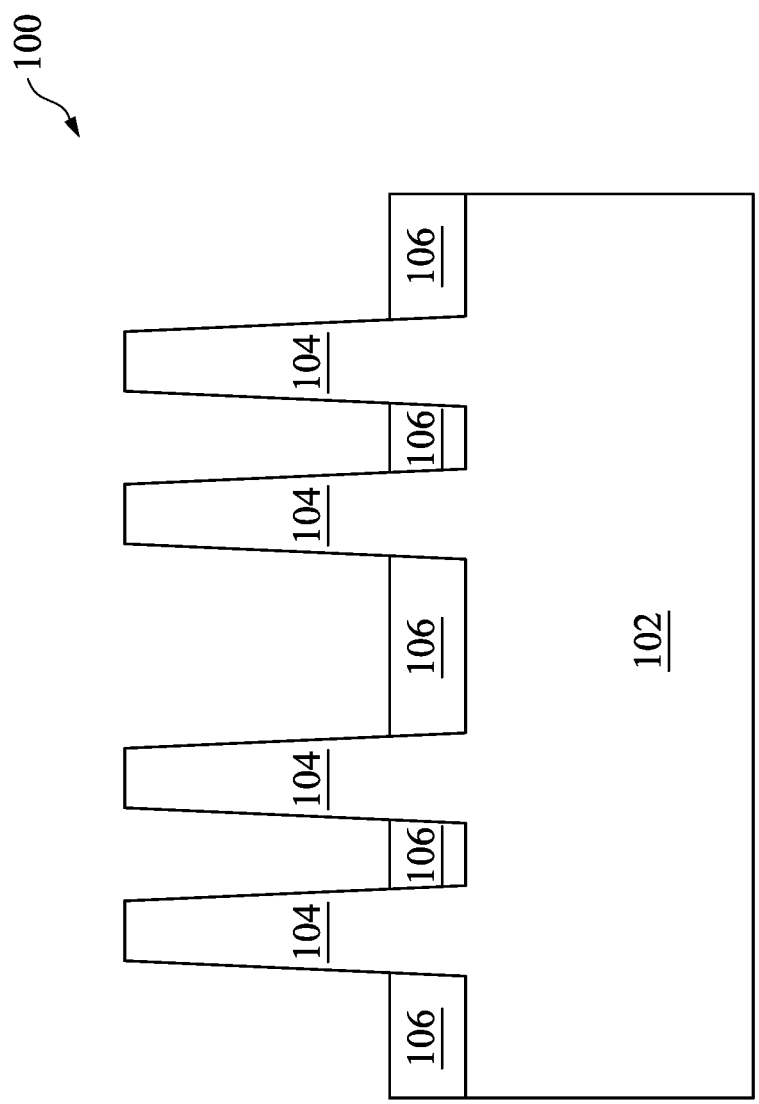
Figure 5A:
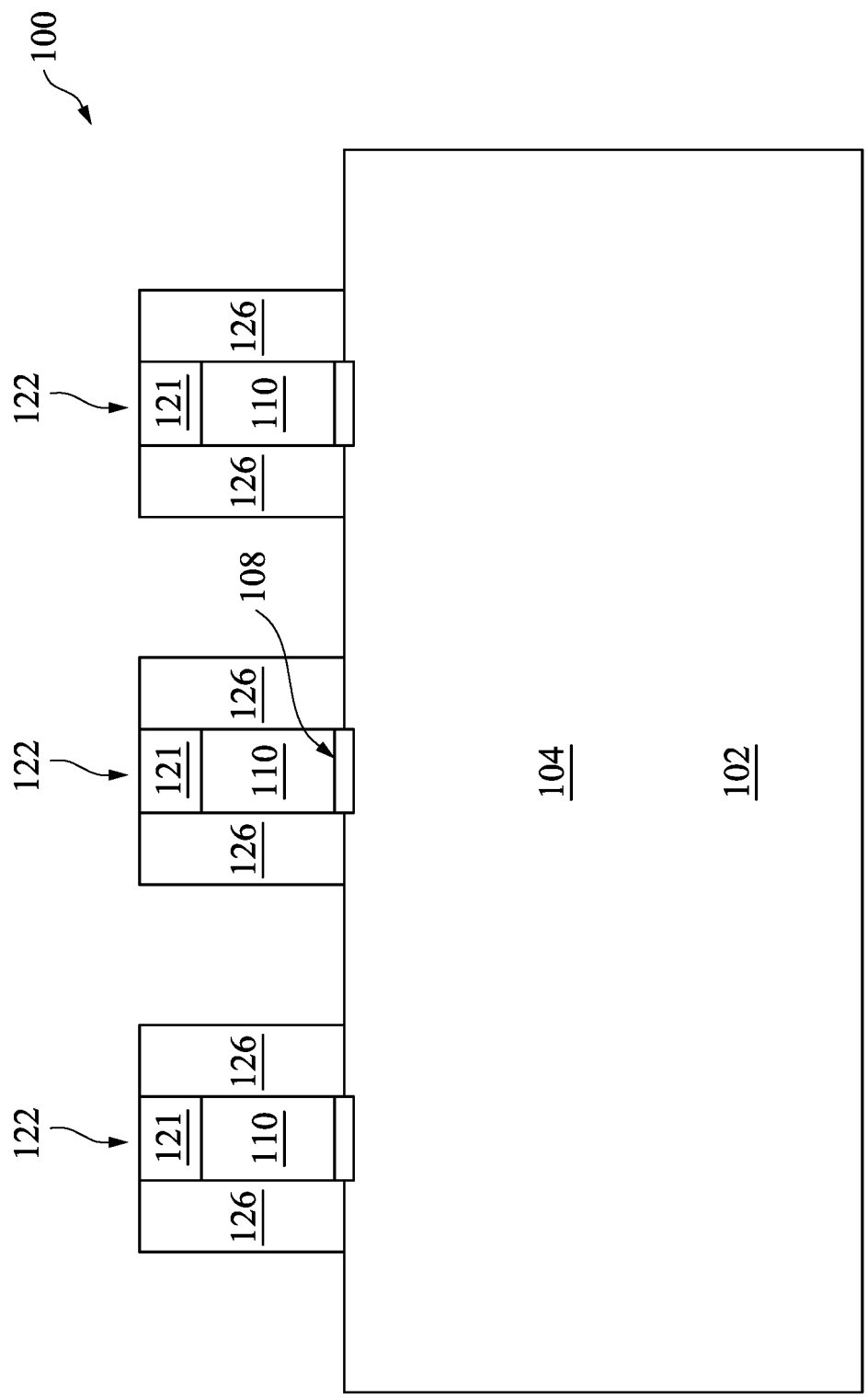
FIGS. 5A, 6A and 7A illustrate cross-sectional views of the FinFET device along cross-section A-A of FIG. 1, in accordance with some embodiments.
Figure 5B:
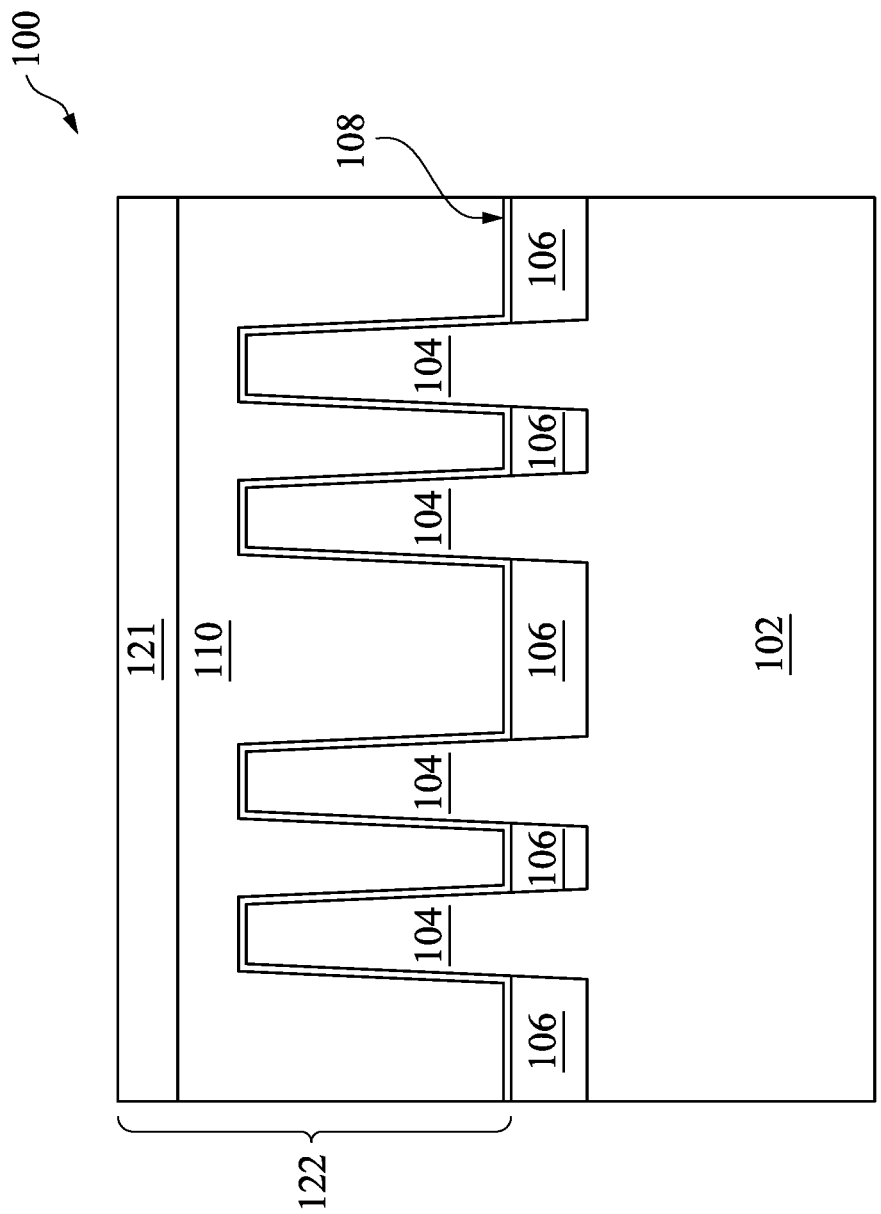
FIGS. 5B and 6B illustrate cross-sectional views of the FinFET device along cross-section B-B of FIG. 1, in accordance with some embodiments.
Figure 5C:
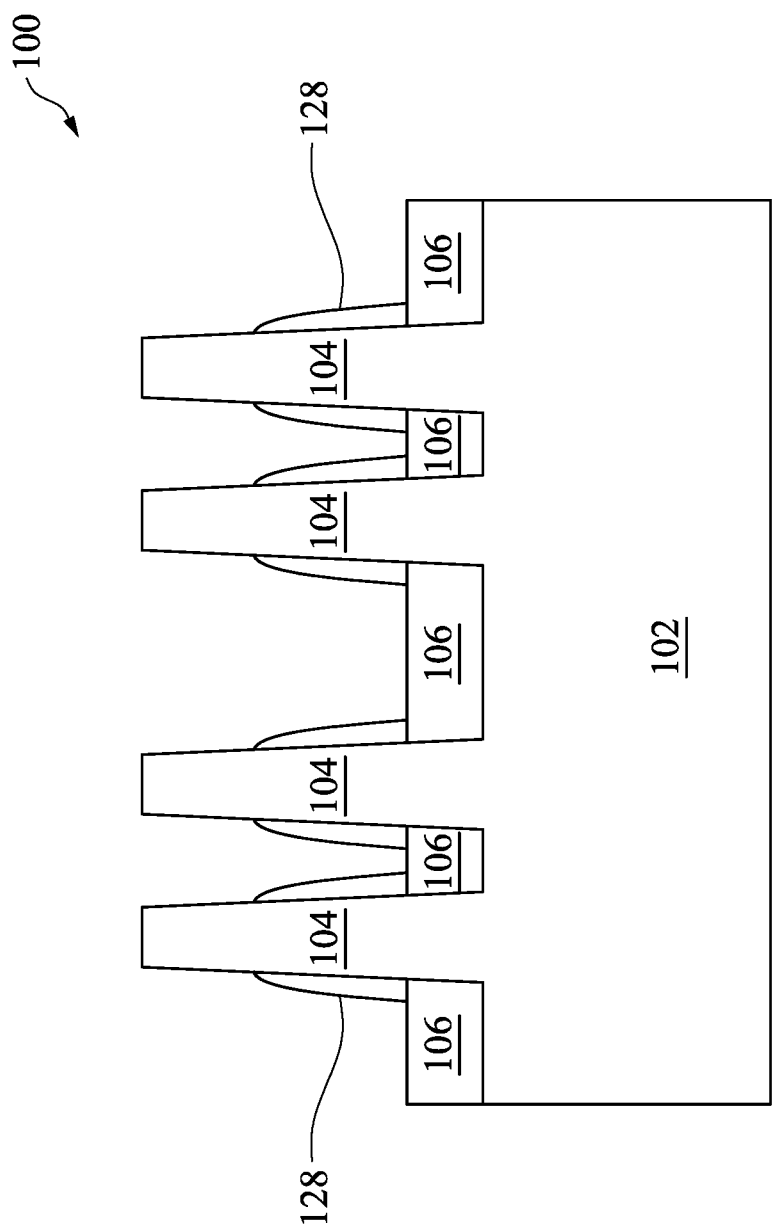
FIGS. 5C and 6C illustrate cross-sectional views of the FinFET device along cross-section B-B of FIG. 1, in accordance with some embodiments.
Figure 6A:
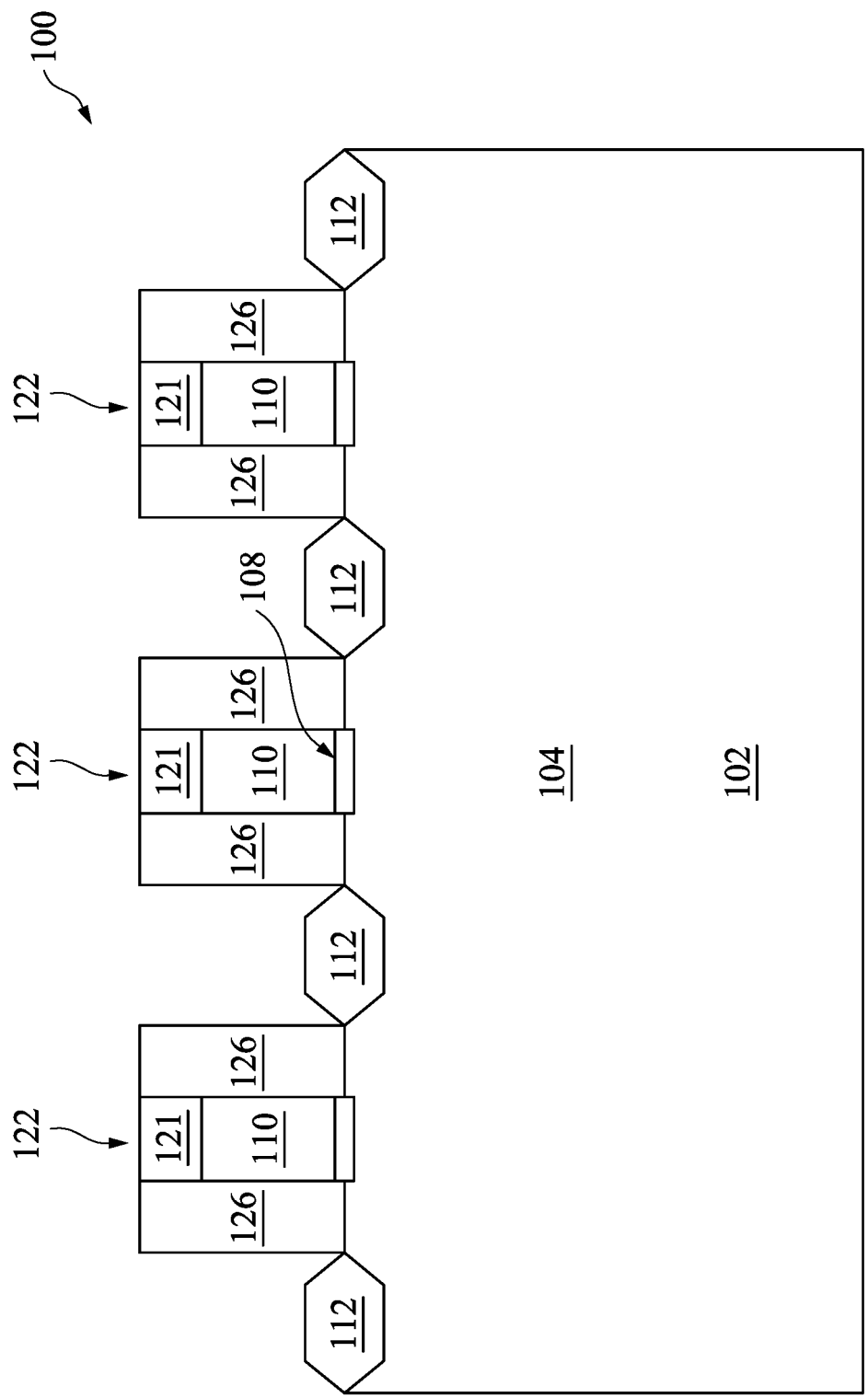
Figure 6B:
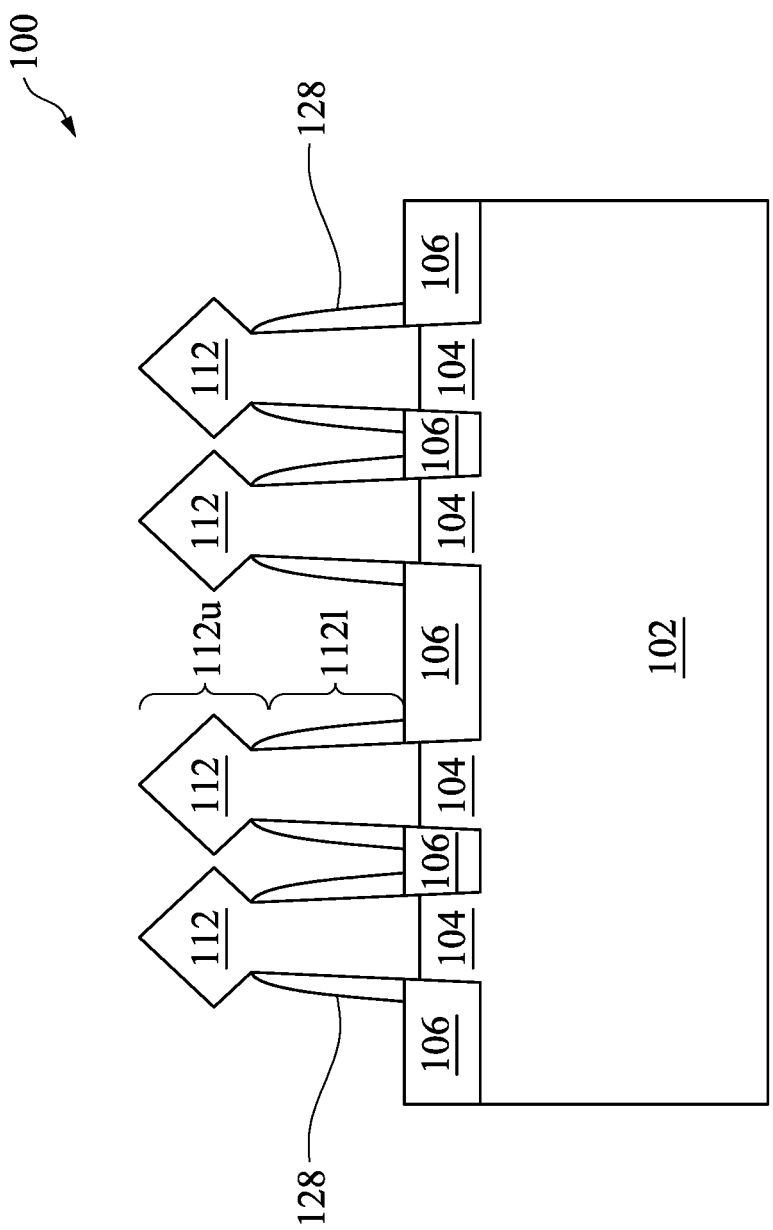
Figure 6C:
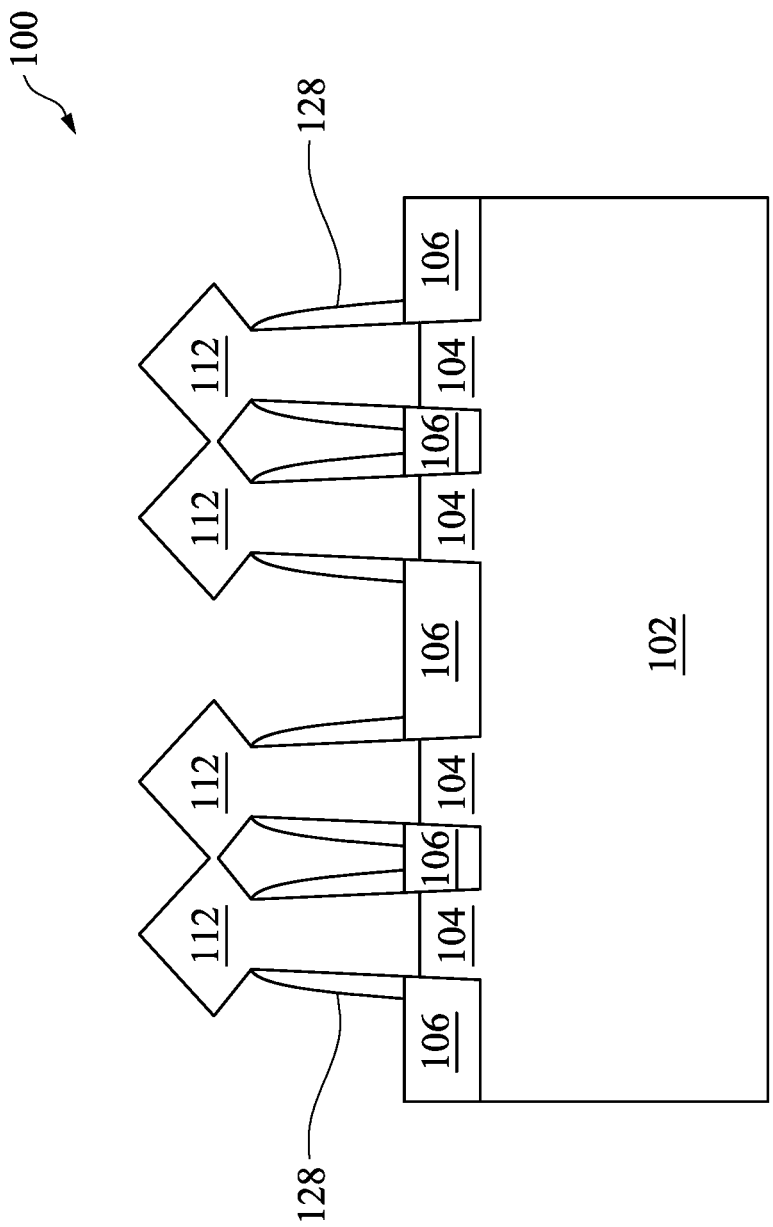
Figure 7A:
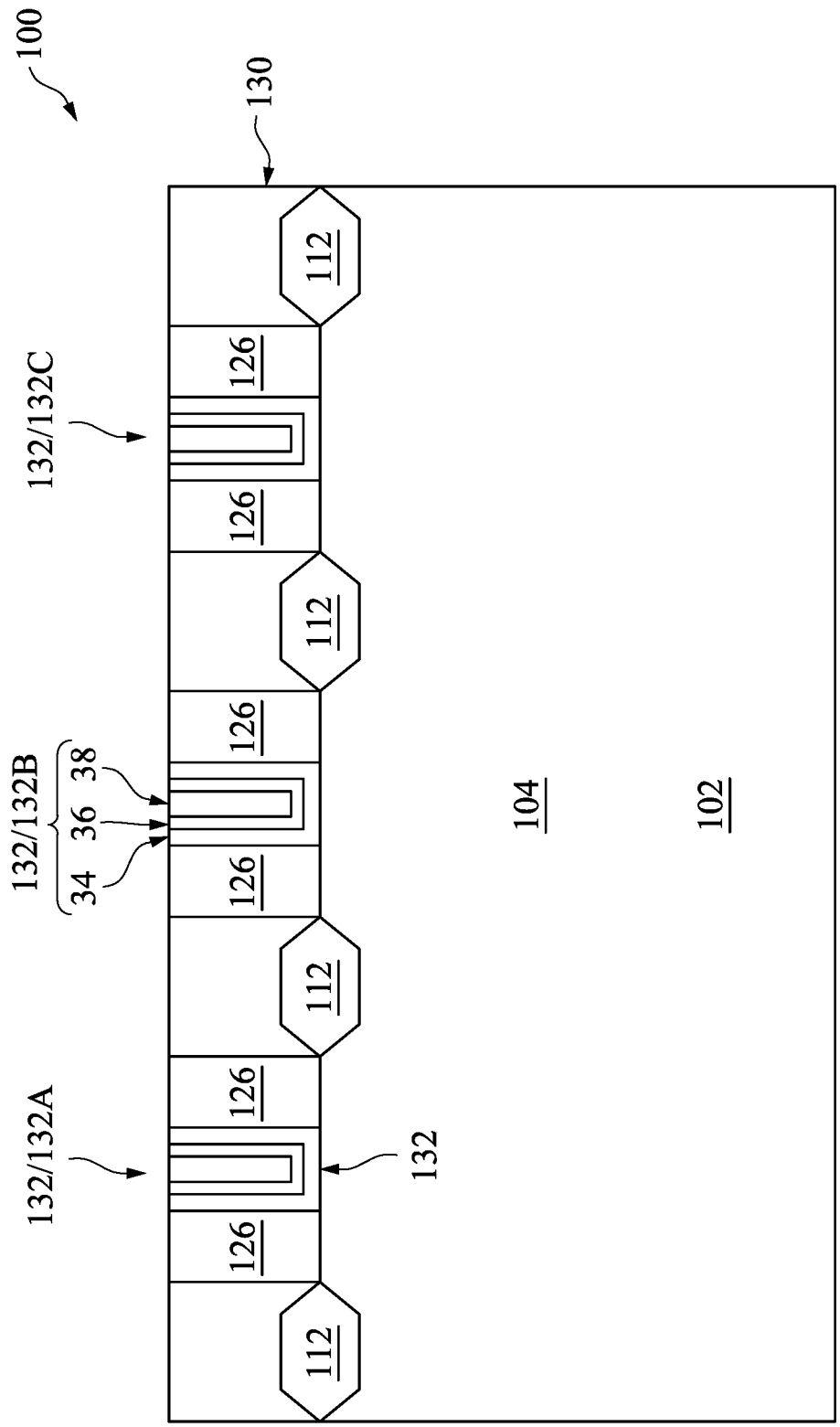
Figure 7B:
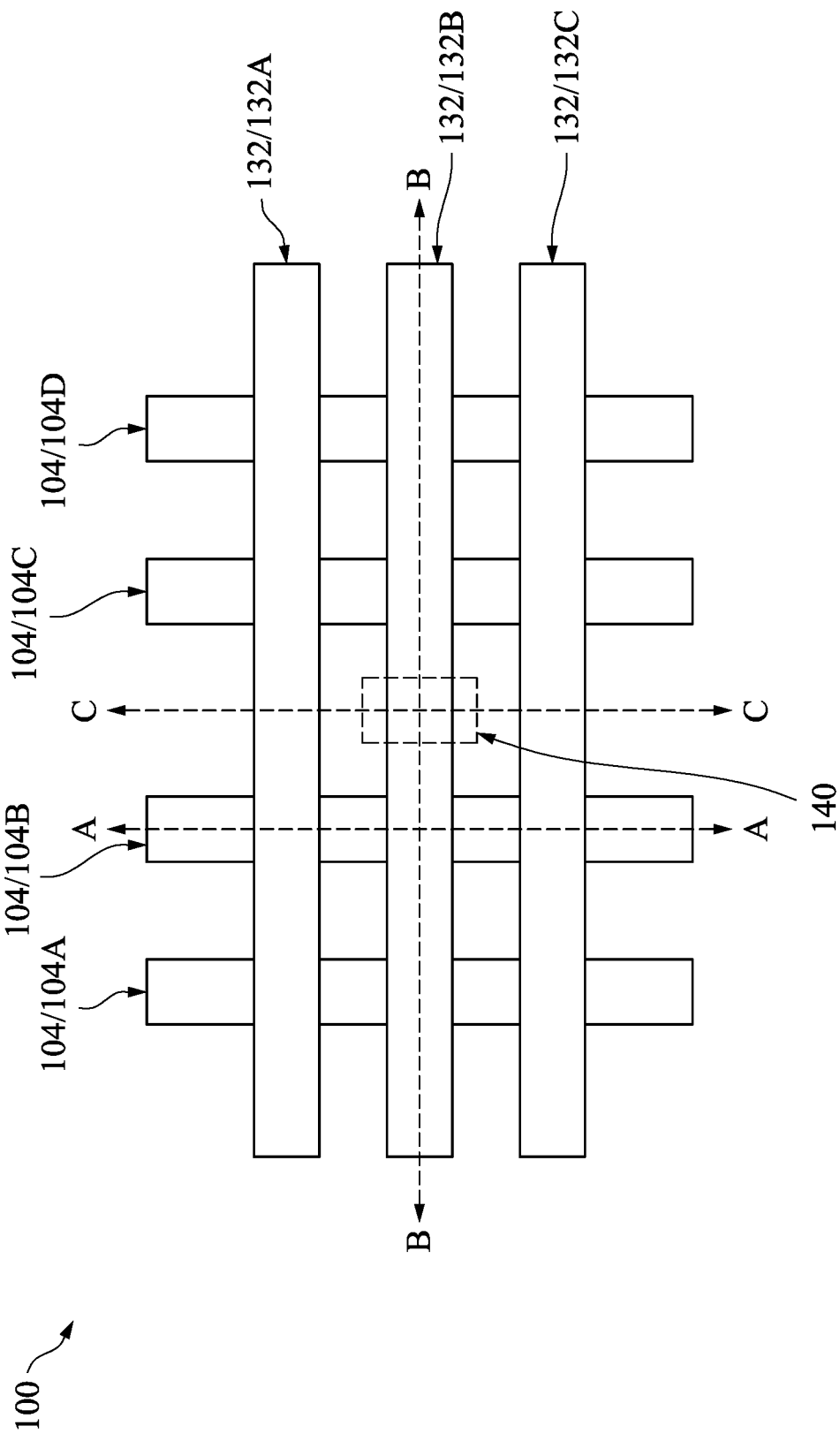
FIG. 7B illustrates a plan view of the FinFET device, in accordance with some embodiments.
Figure 7C:
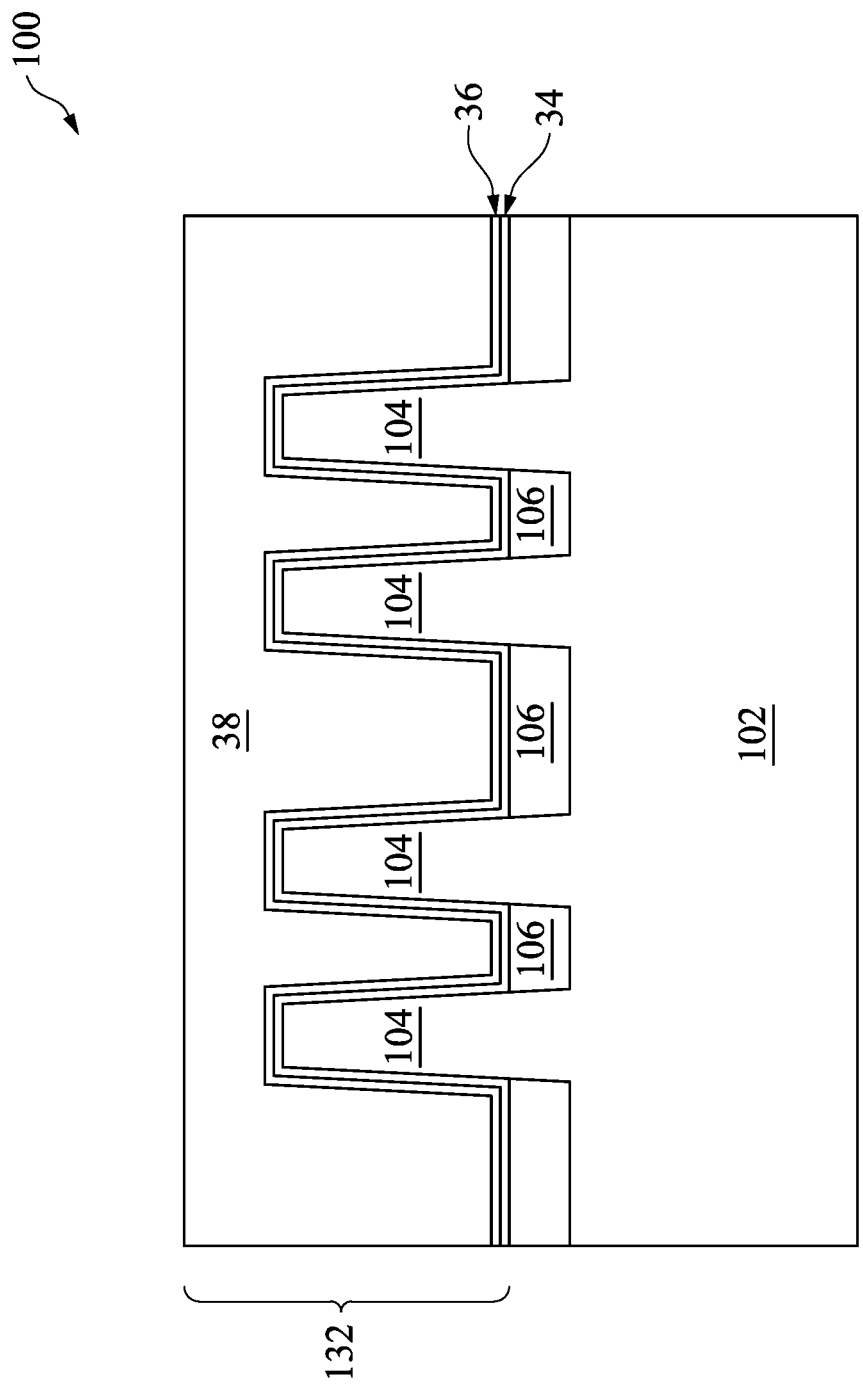
FIG. 7C illustrates a cross-sectional view along cross-section B-B of FIG. 7B, in accordance with some embodiments.
Figure 7D:
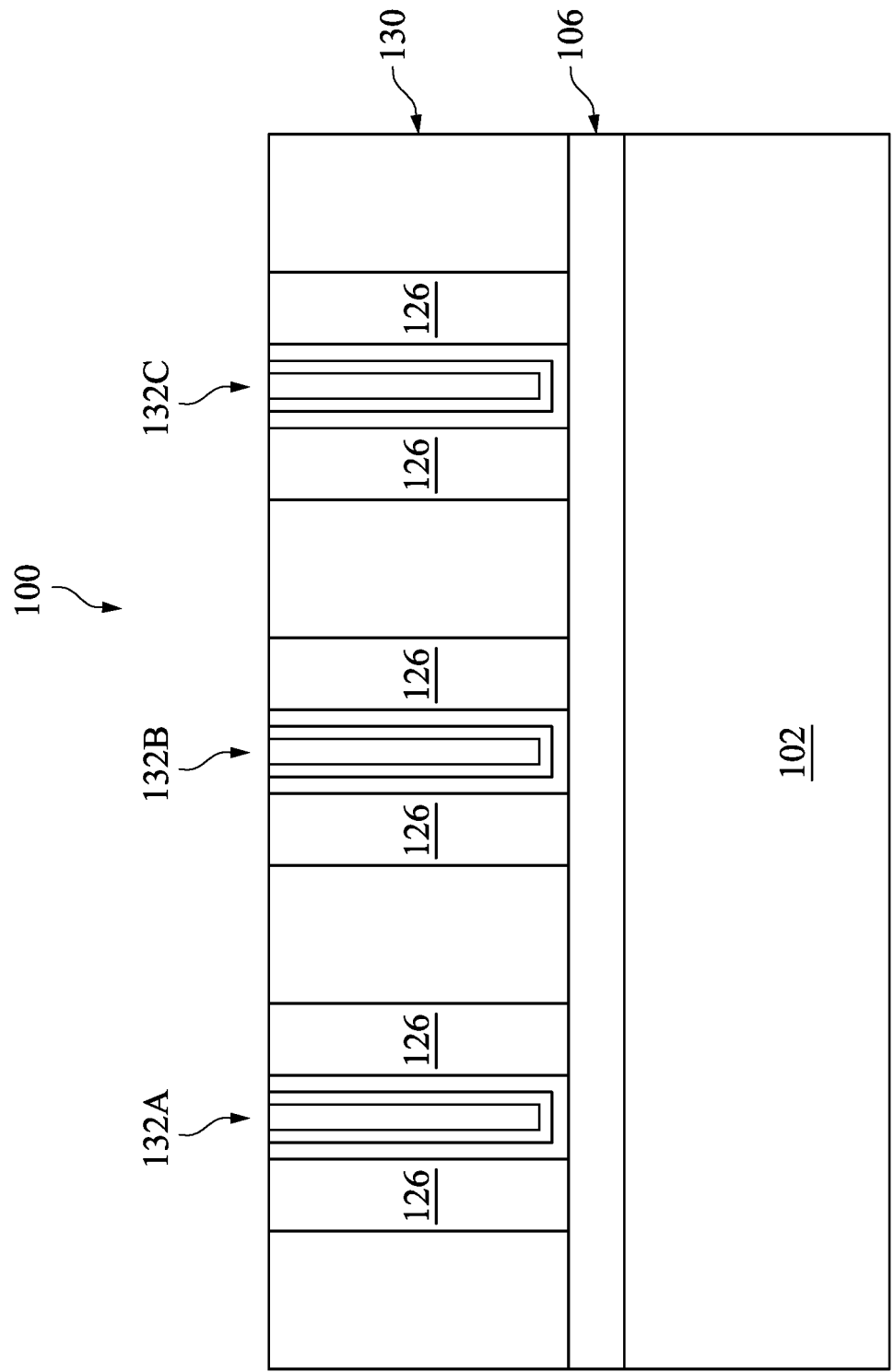
FIG. 7D illustrates a cross-sectional view along cross-section C-C of FIG. 7A, in accordance with some embodiments.
Figure 8A:
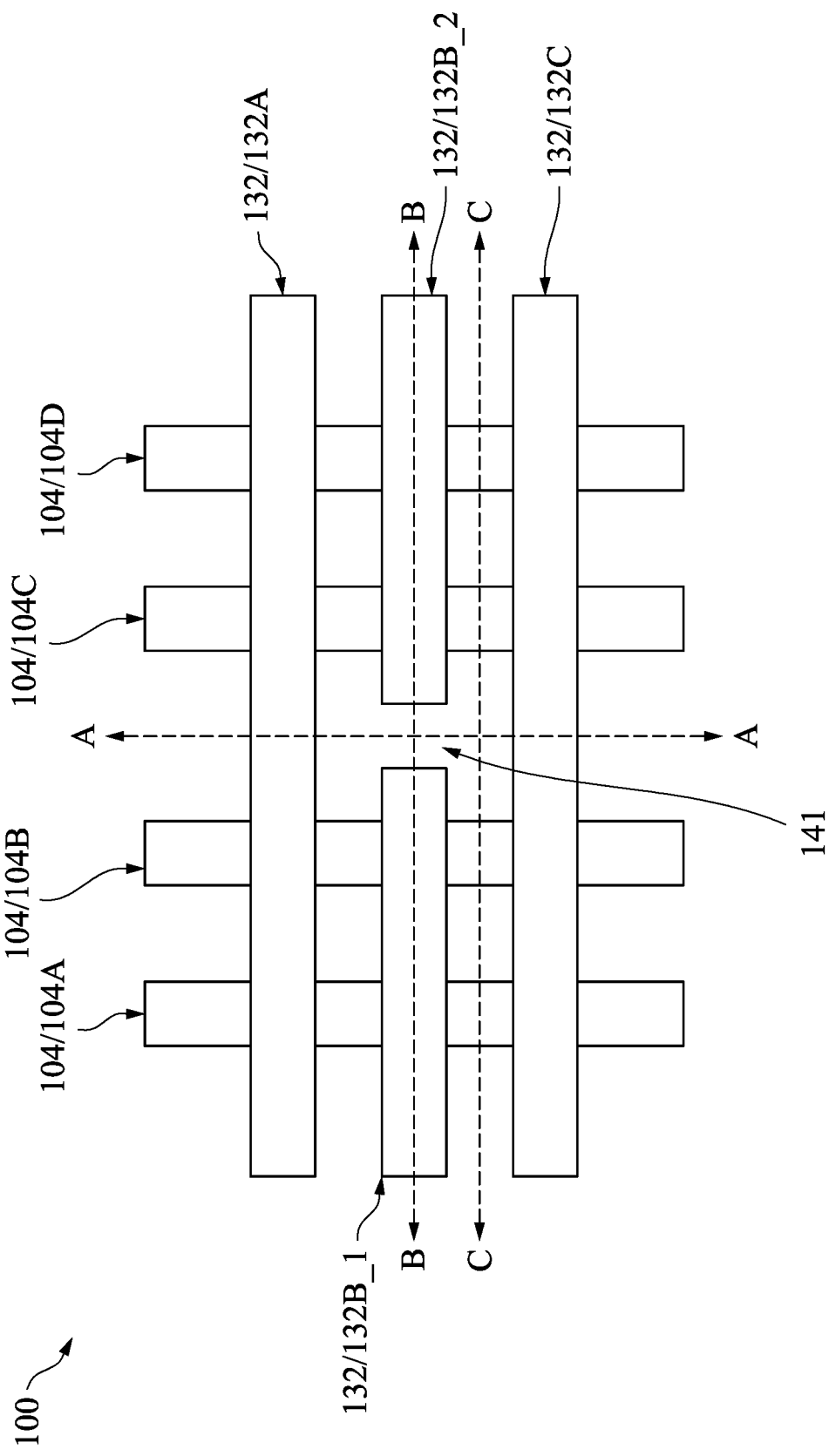
FIG. 8A illustrates a plan view of the FinFET, in accordance with some embodiments.
Figure 8B:
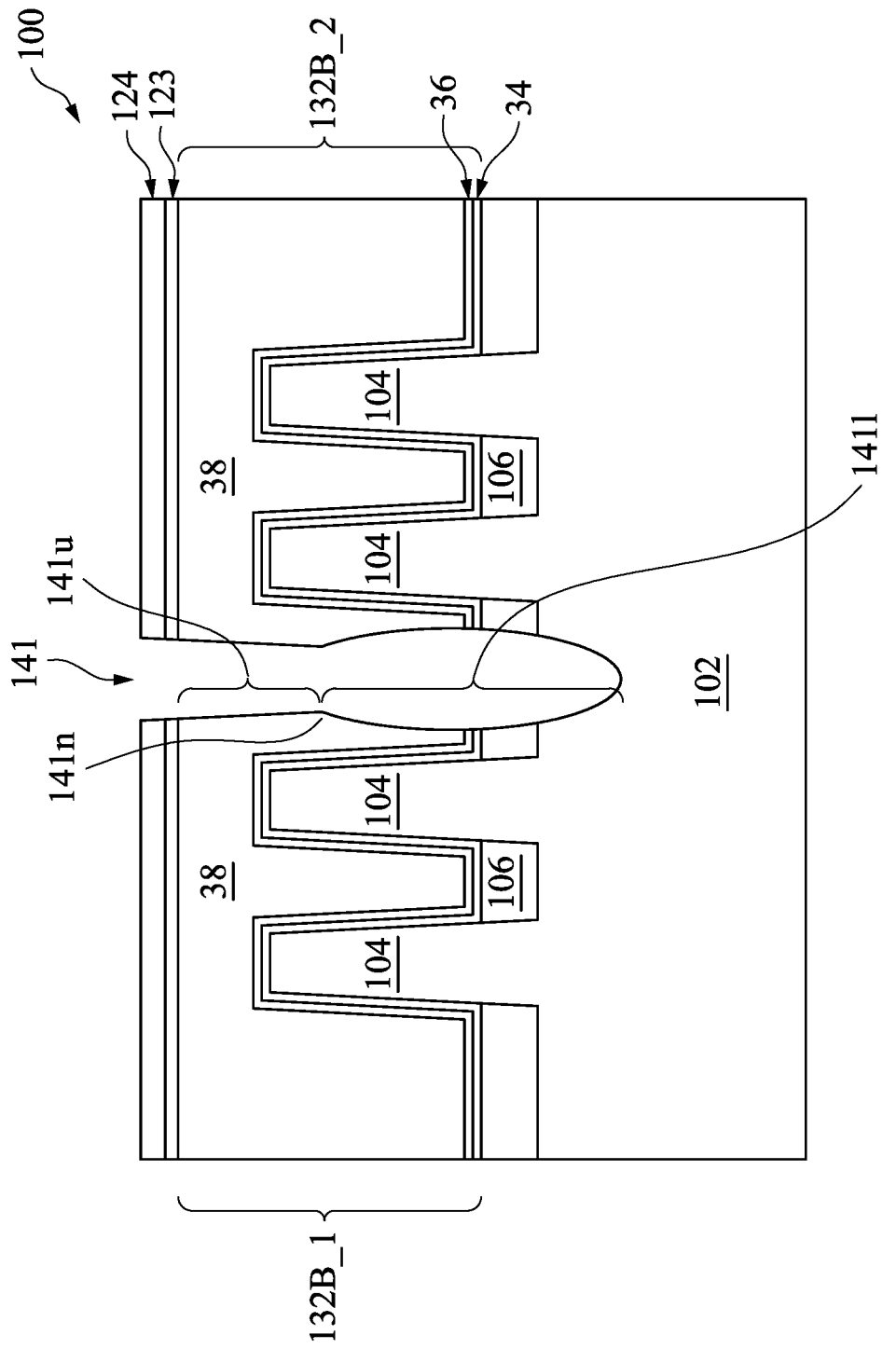
FIG. 8B illustrates a cross-sectional view of the FinFET along cross-section B-B of FIG. 8A, in accordance with some embodiments.
Figure 8C:
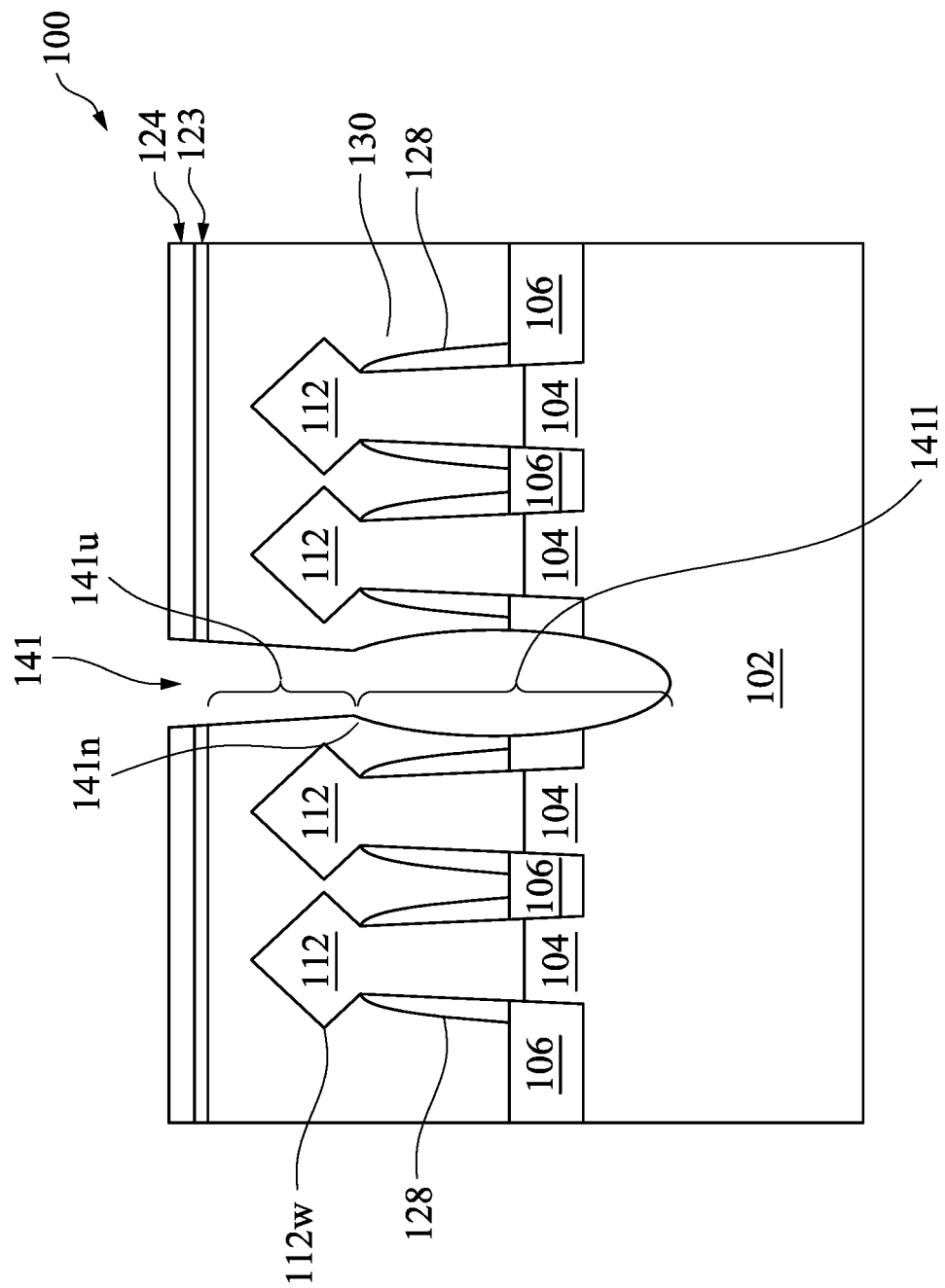
FIG. 8C illustrates a cross-sectional view of the FinFET along cross-section C-C of FIG. 8A, in accordance with some embodiments.
Figure 8D:
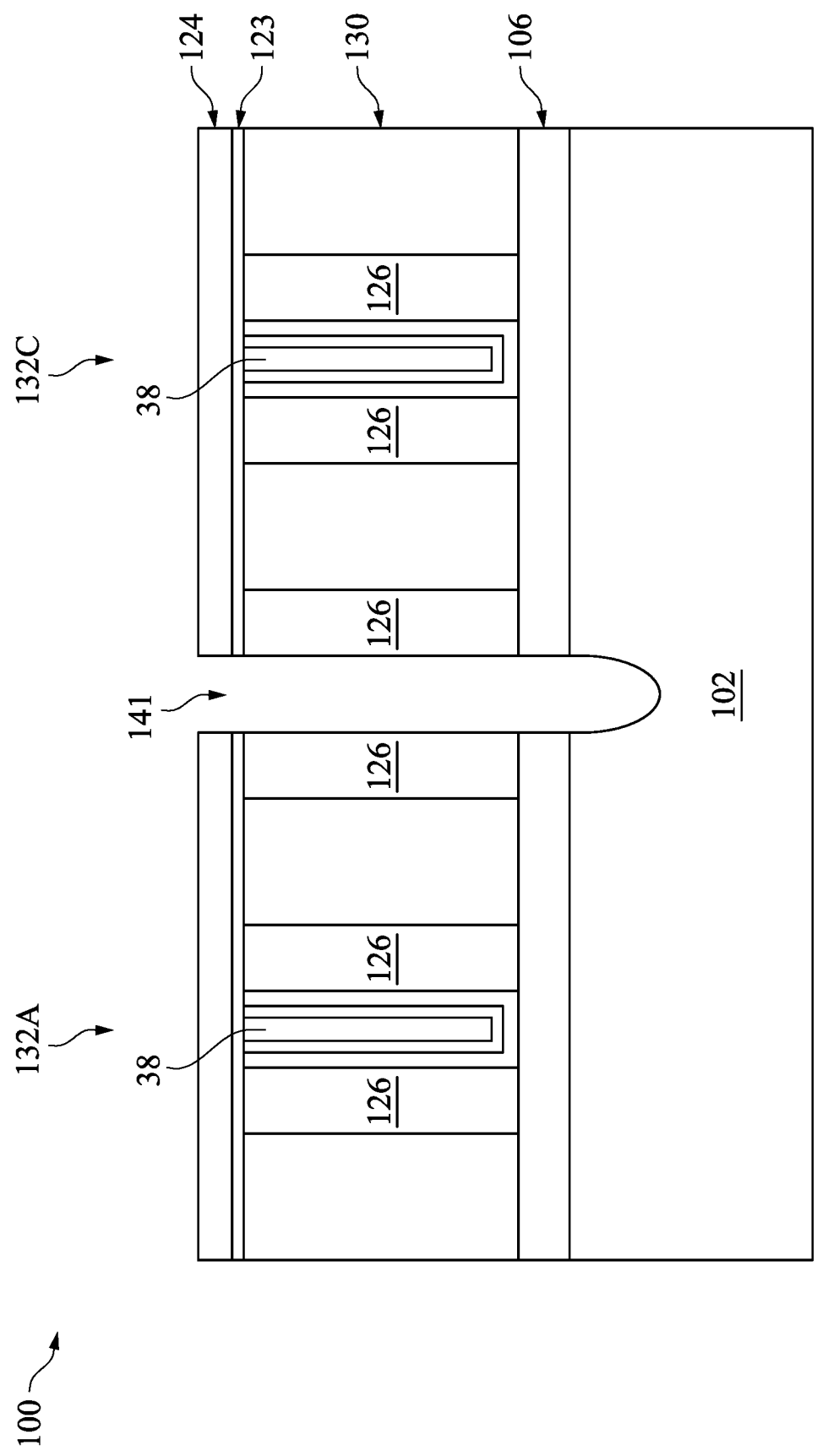
FIG. 8D illustrates a cross-sectional view of the FinFET along cross-section A-A of FIG. 8A, in accordance with some embodiments.
Figure 12:
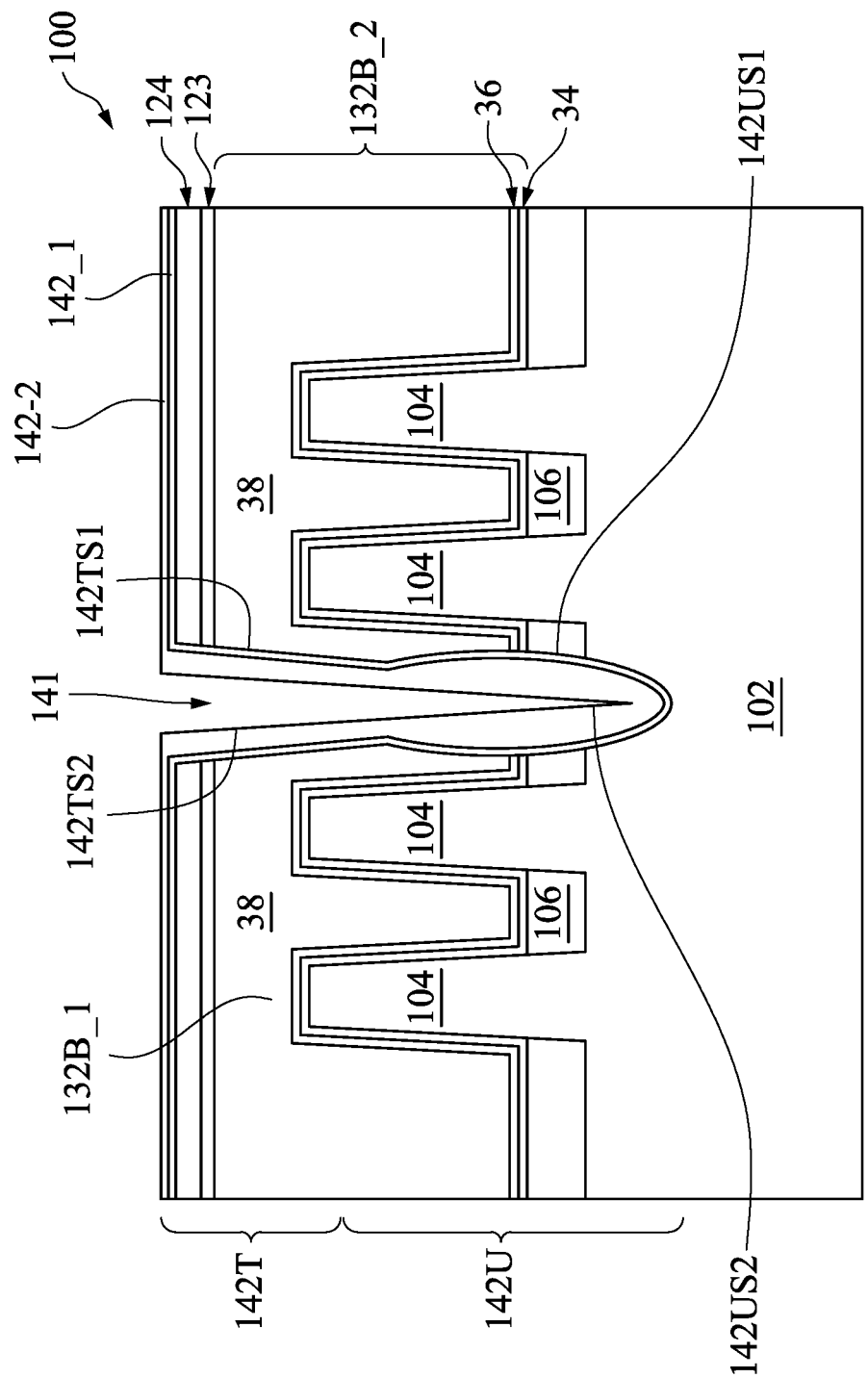
Figure 13A:
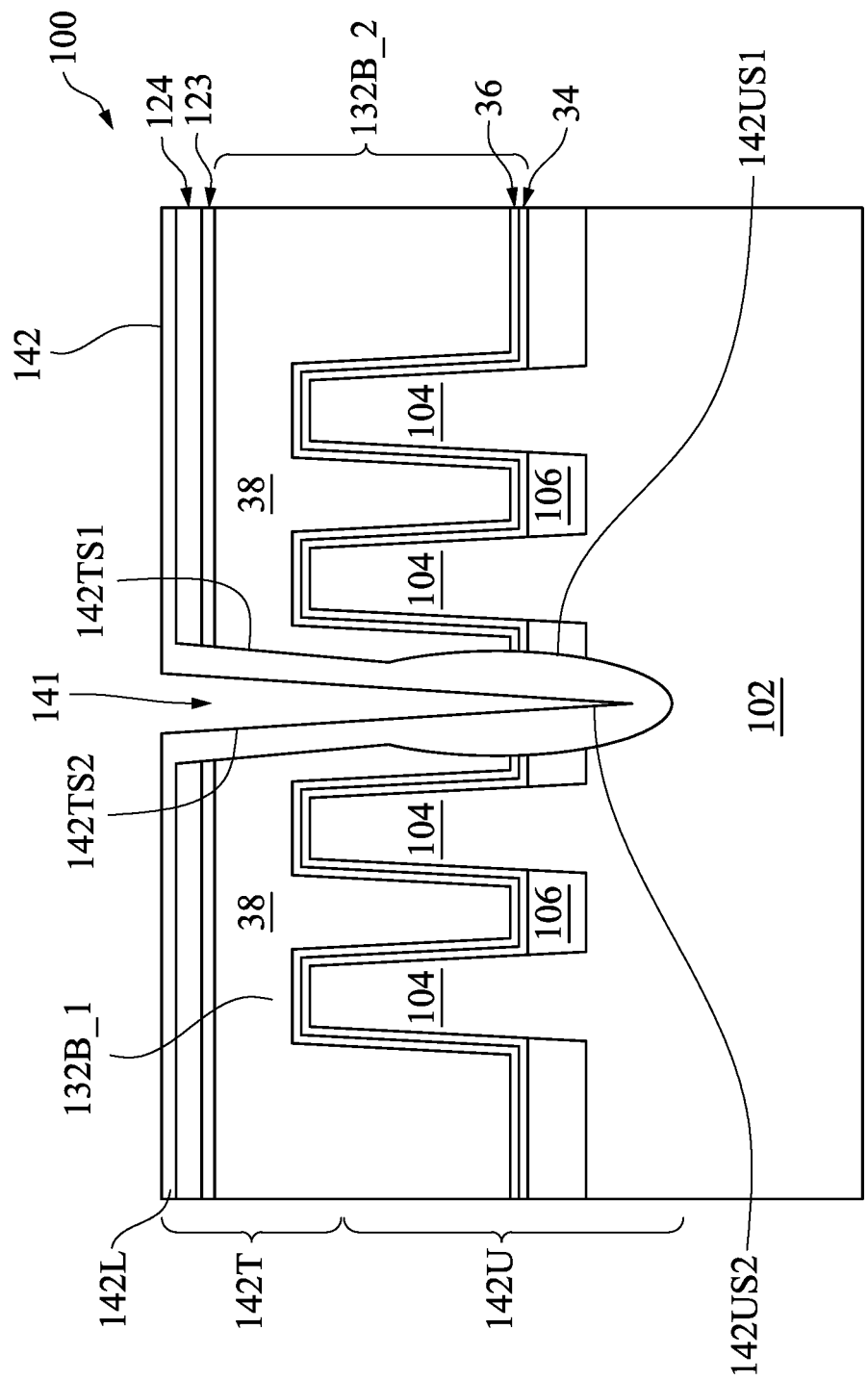
Figure 13B:
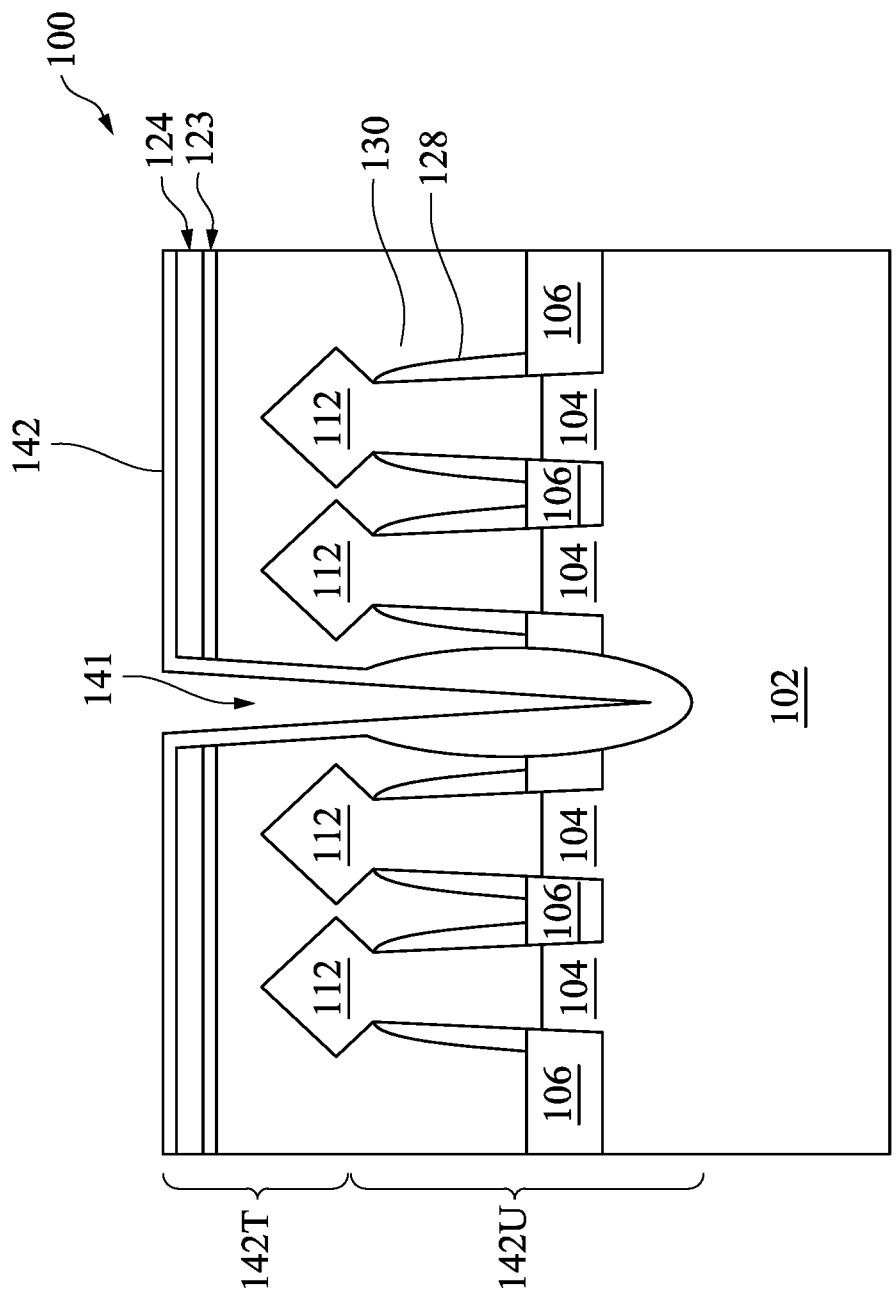
FIGS. 13B and 14B illustrate cross-sectional views along cross-section C-C of FIG. 1, in accordance with some embodiments.
Figure 13C:
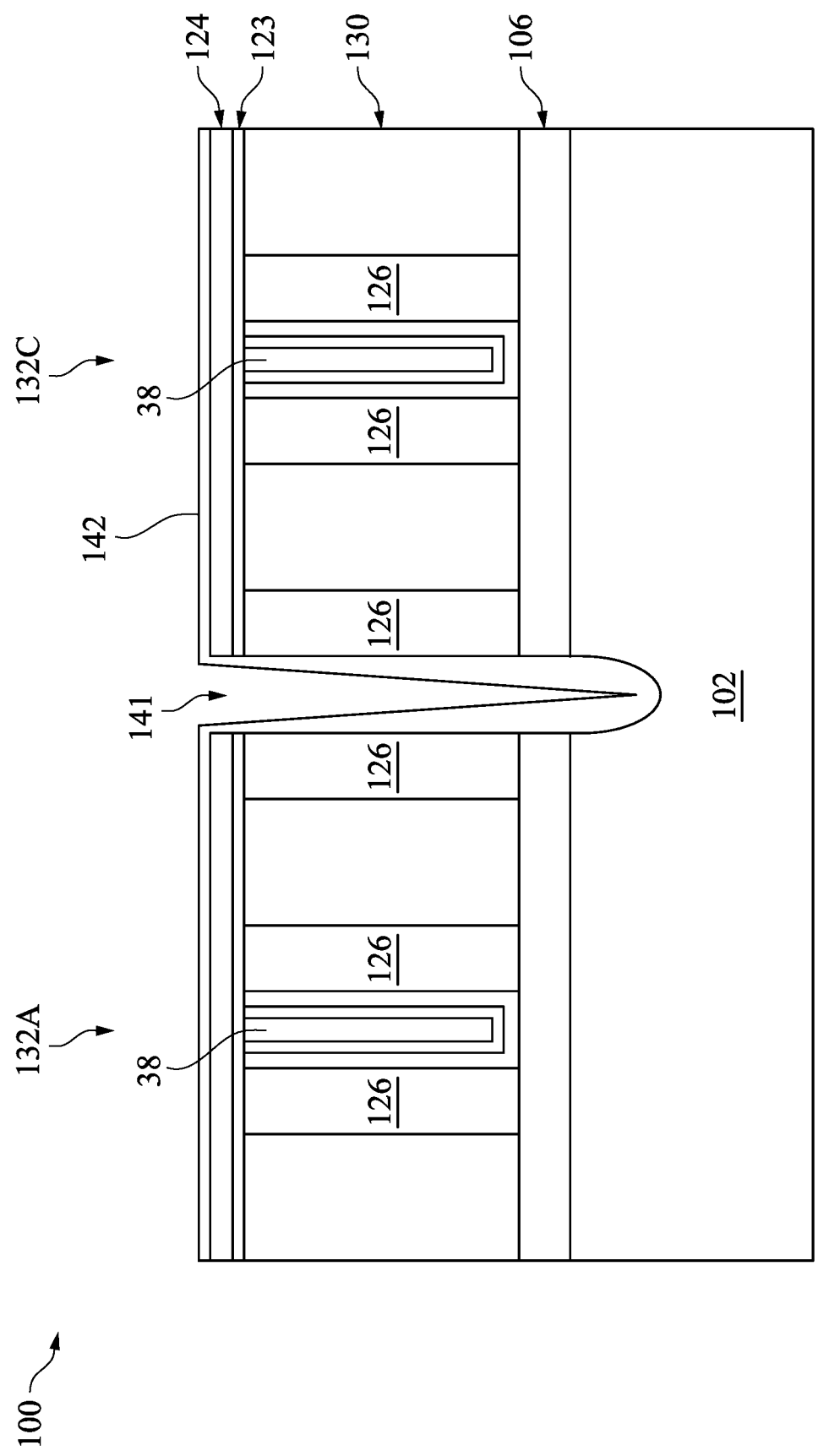
FIGS. 13C and 14C illustrate cross-sectional views along cross-section A-A of FIG. 8A, in accordance with some embodiments.
Figure 14A:
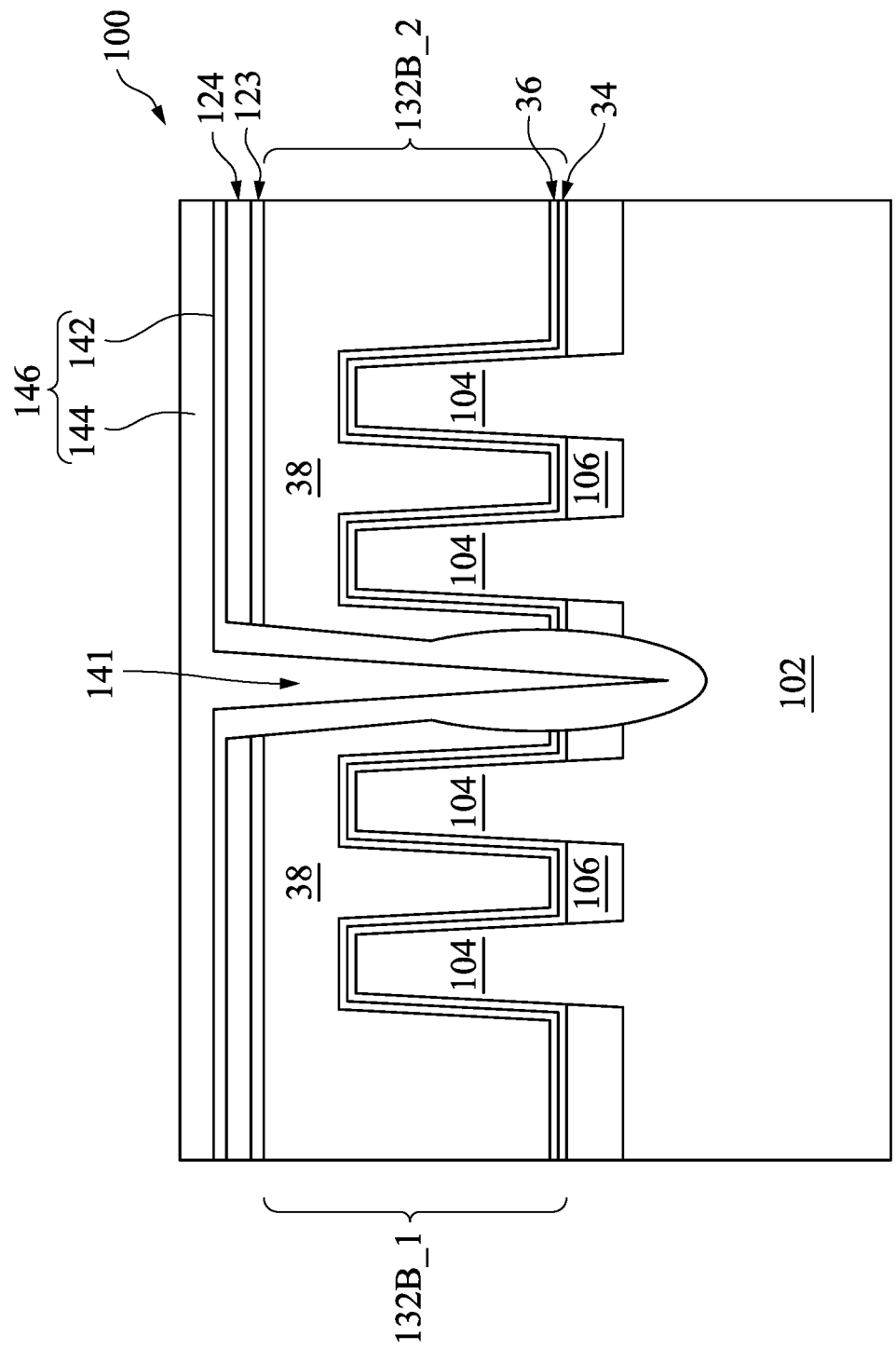
Figure 14B:
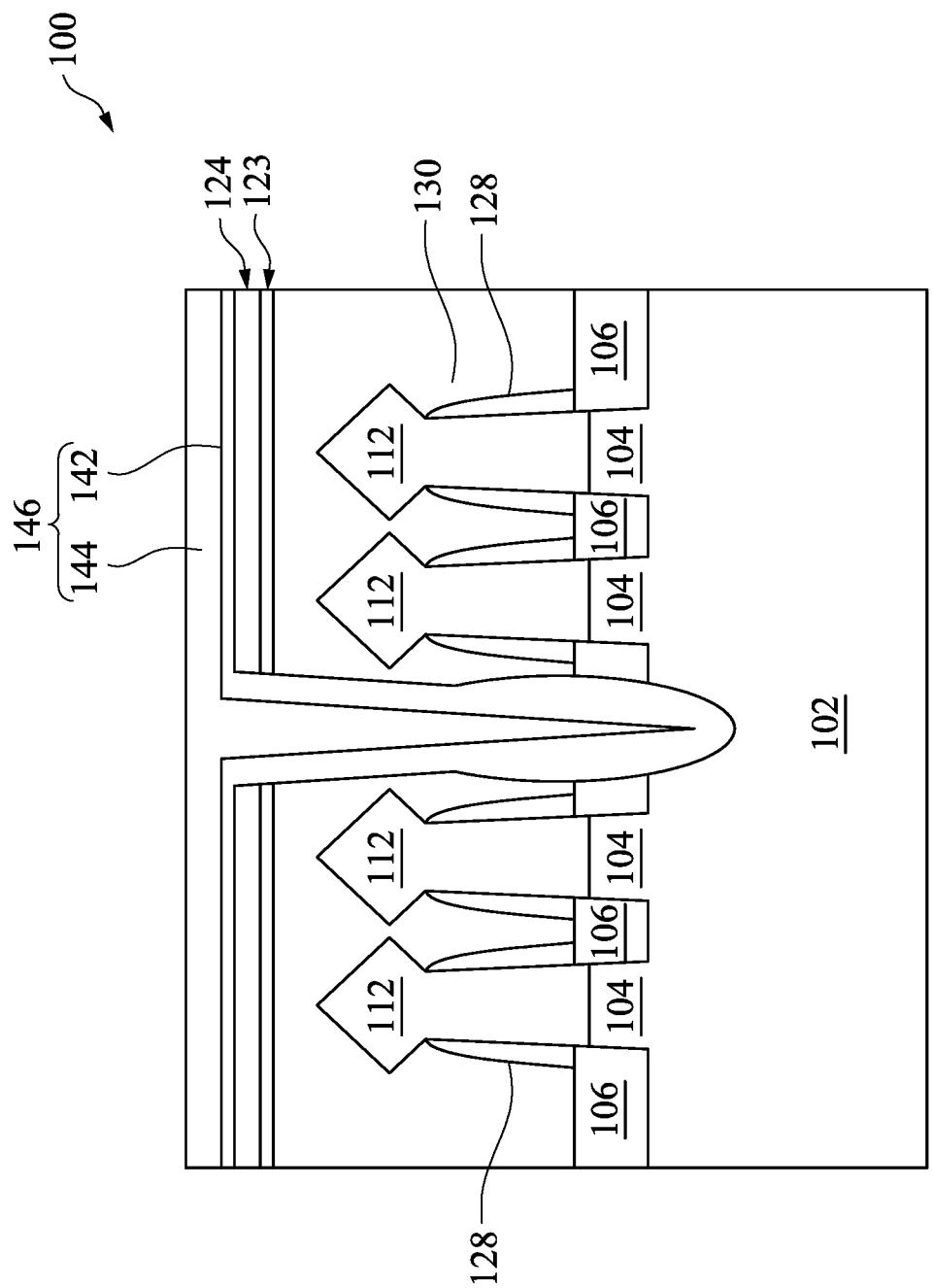
Figure 14C:
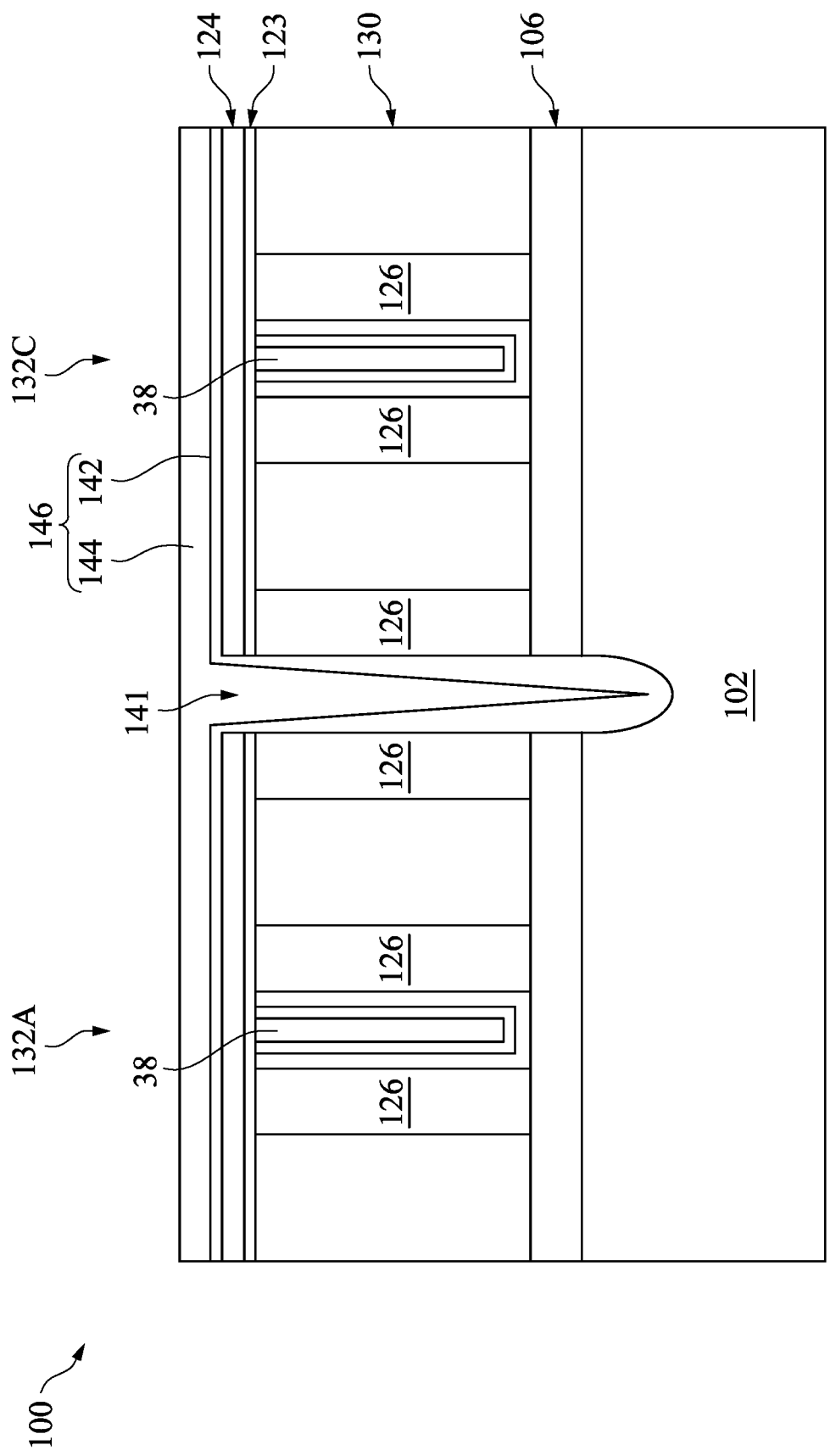
Figure 15A:
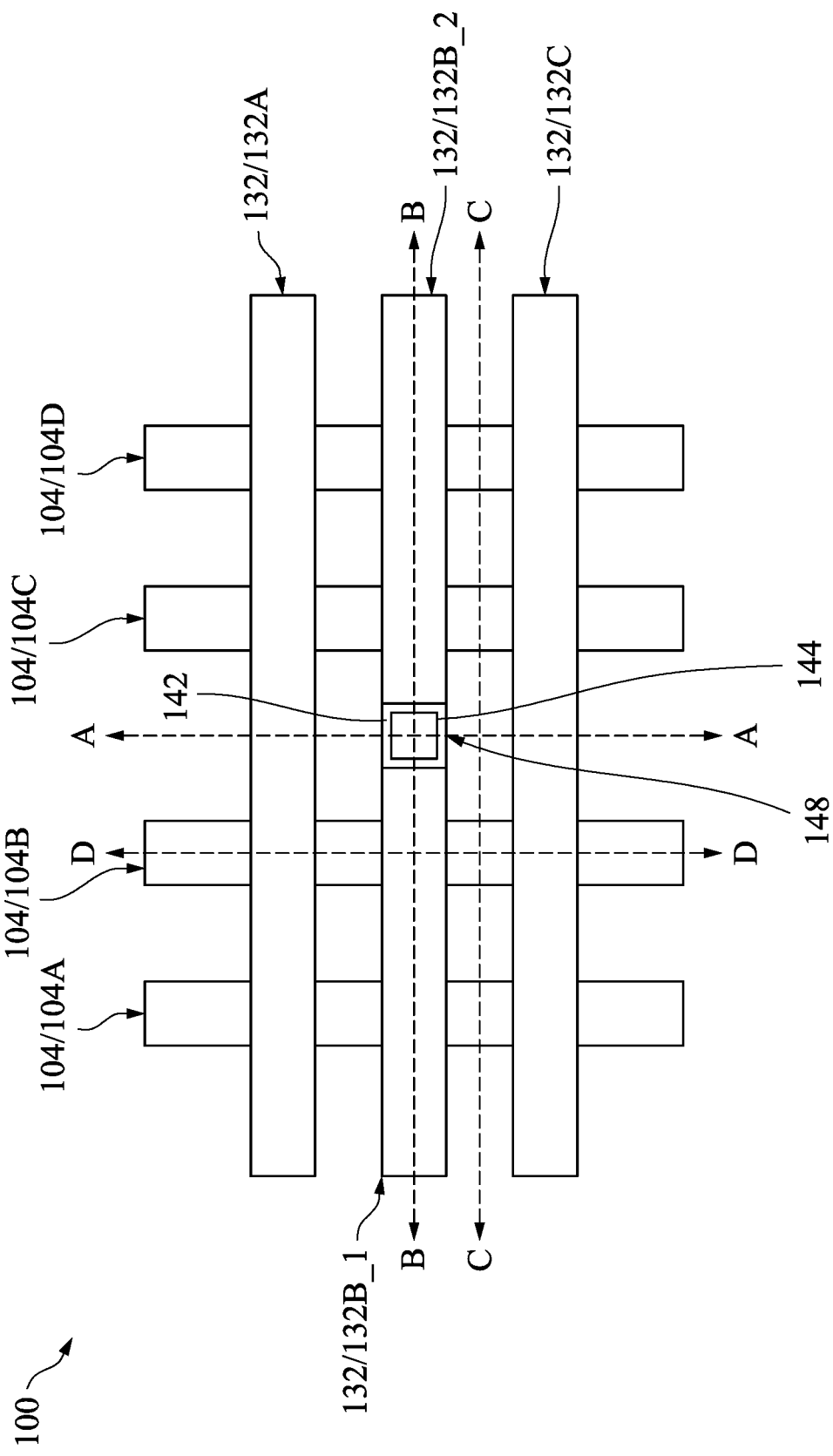
FIG. 15A illustrates a plan view of the FinFET, in accordance with some embodiments.
Figure 15B:
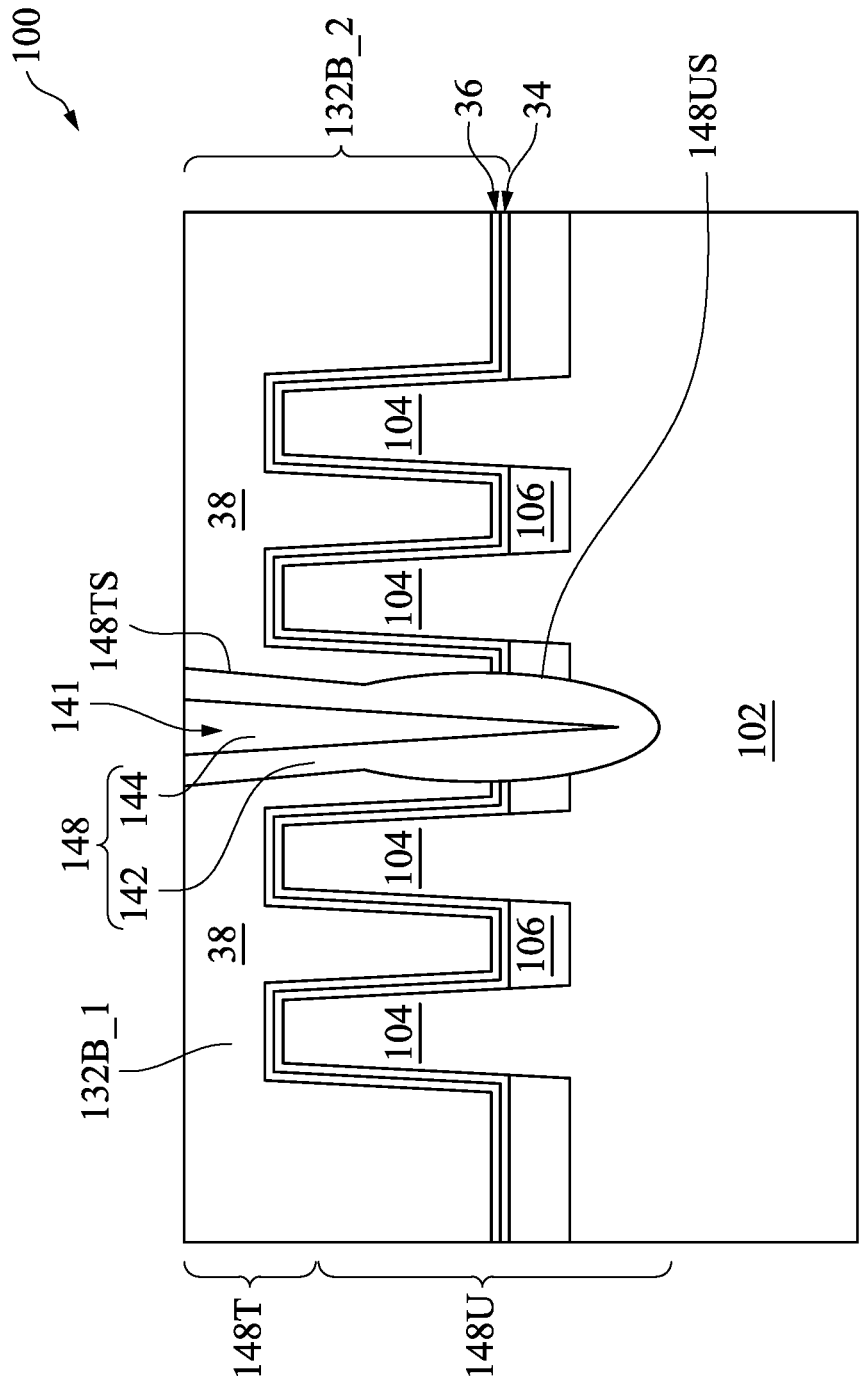
FIG. 15B illustrates a cross-sectional view along cross-section B-B of FIG. 15A, in accordance with some embodiments.
Figure 15C:
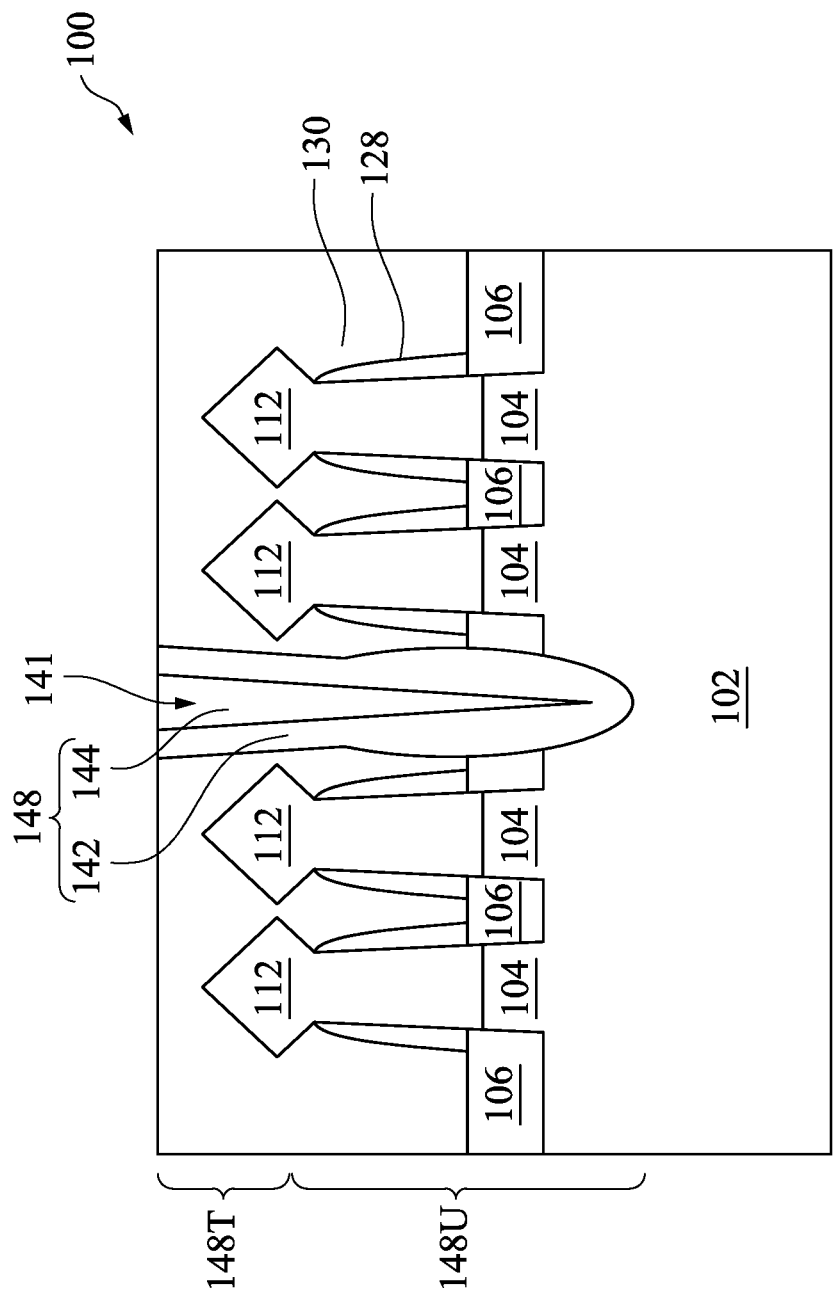
FIG. 15C illustrates a cross-sectional view along cross-section C-C of FIG. 15A, in accordance with some embodiments.
Figure 15D:
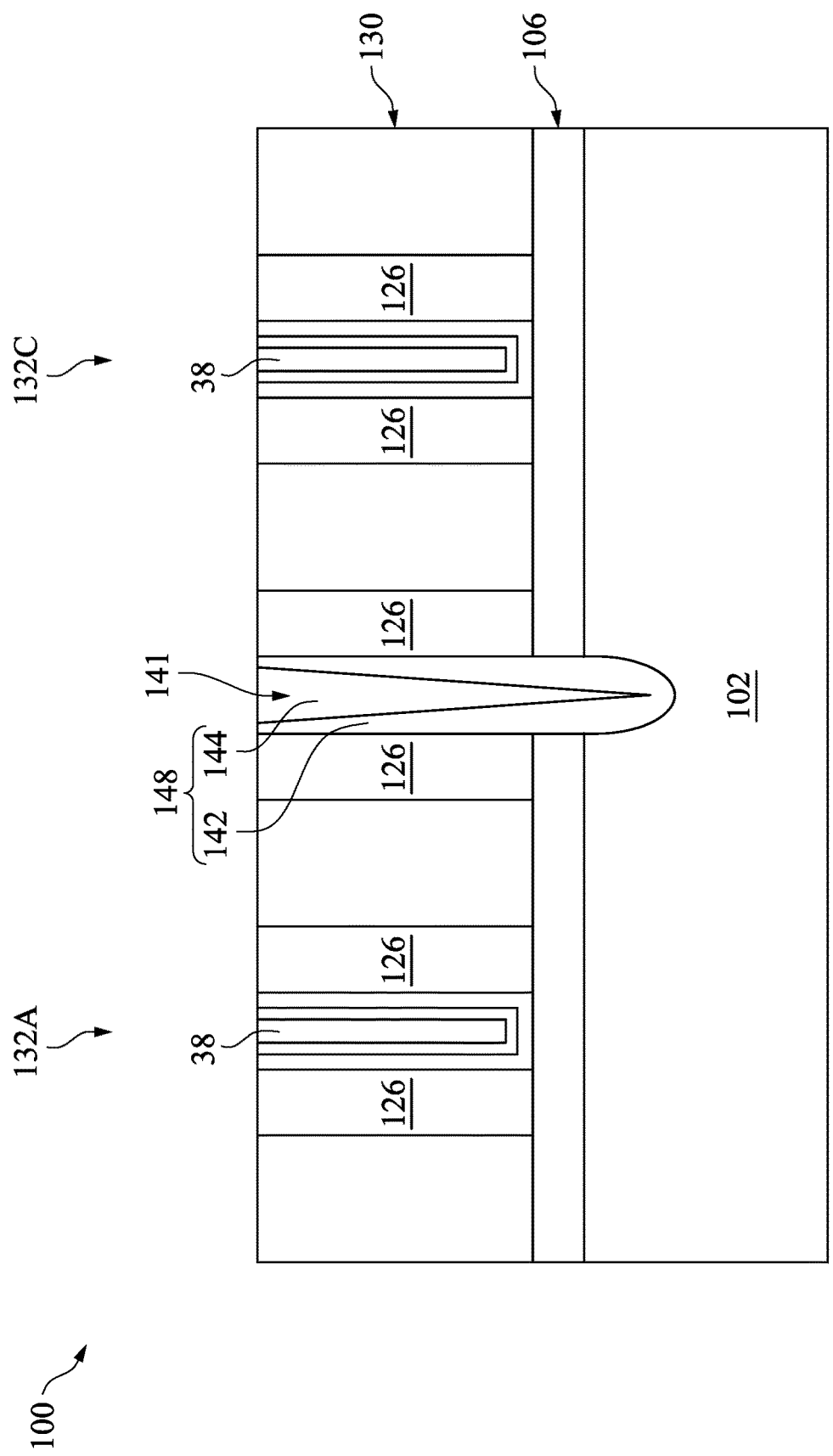
FIG. 15D illustrates a cross-sectional view along cross-section A-A of FIG. 15A, in accordance with some embodiments.
Figure 16A:
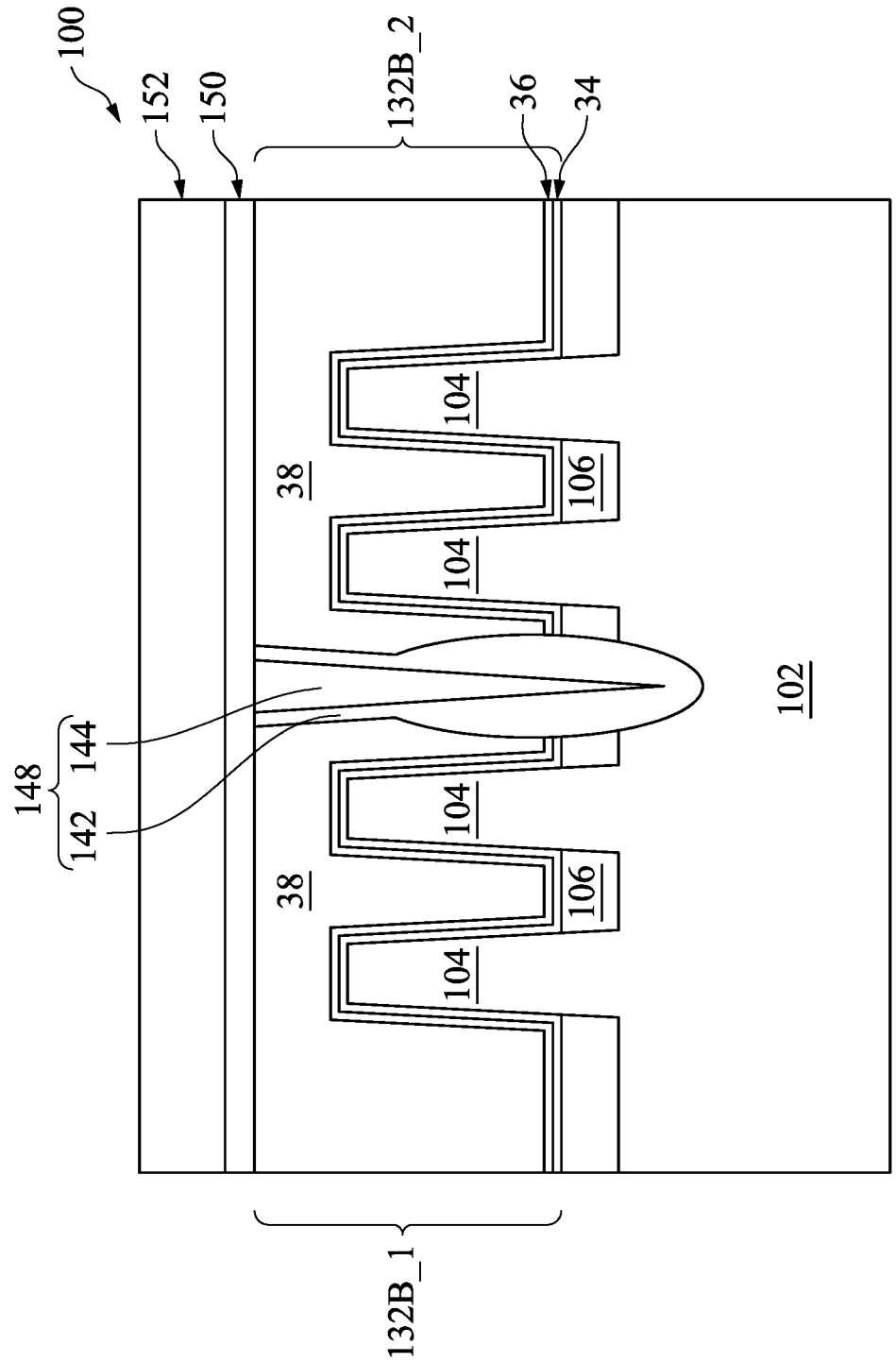
FIG. 16A illustrates a cross-sectional view along cross-section B-B of FIG. 1, in accordance with some embodiments.
Figure 16B:
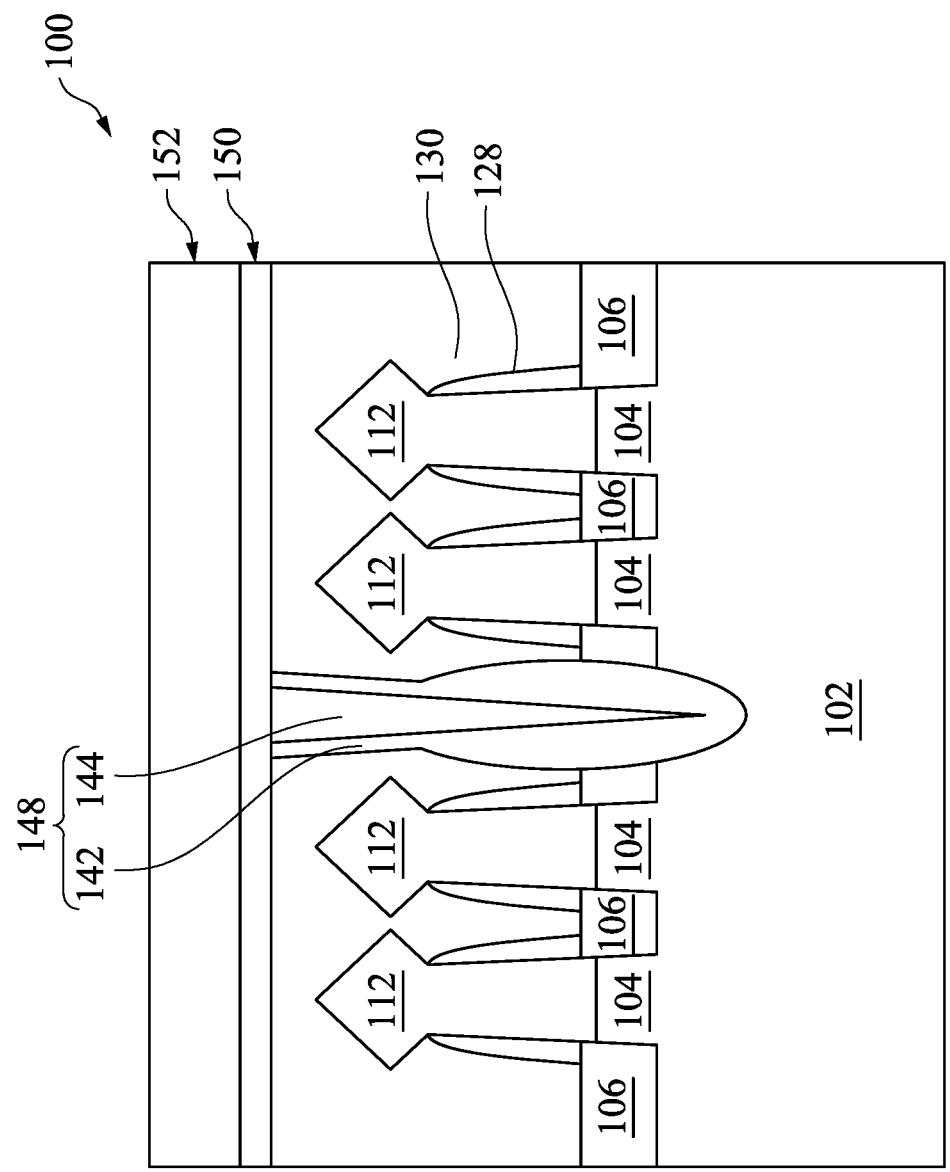
FIG. 16B illustrates a cross-sectional view along cross-section C-C, in accordance with some embodiments.
Figure 16C:
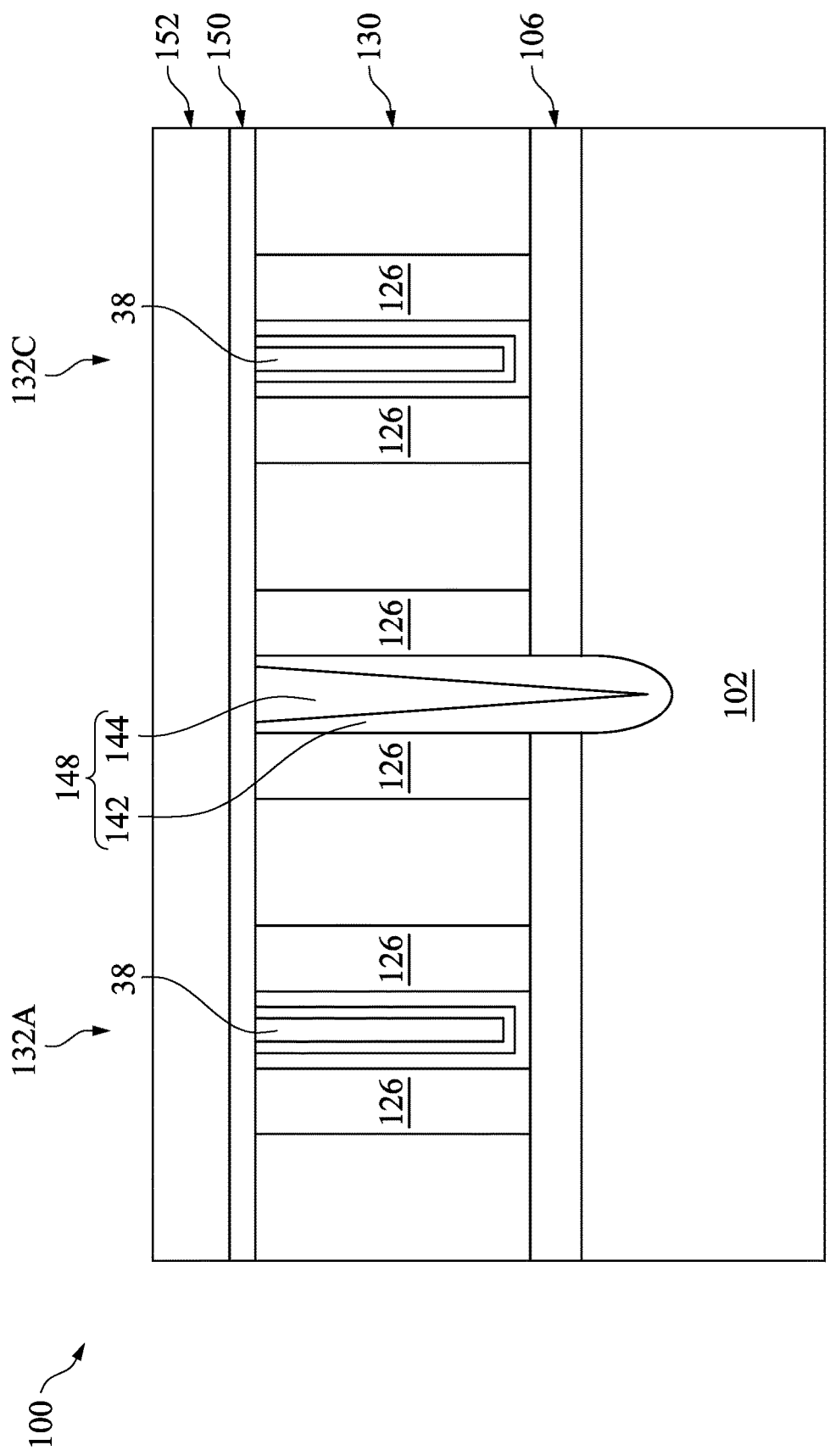
FIG. 16C illustrates a cross-sectional view along cross-section C-C of FIG. 15A, in accordance with some embodiments.
Figure 17A:
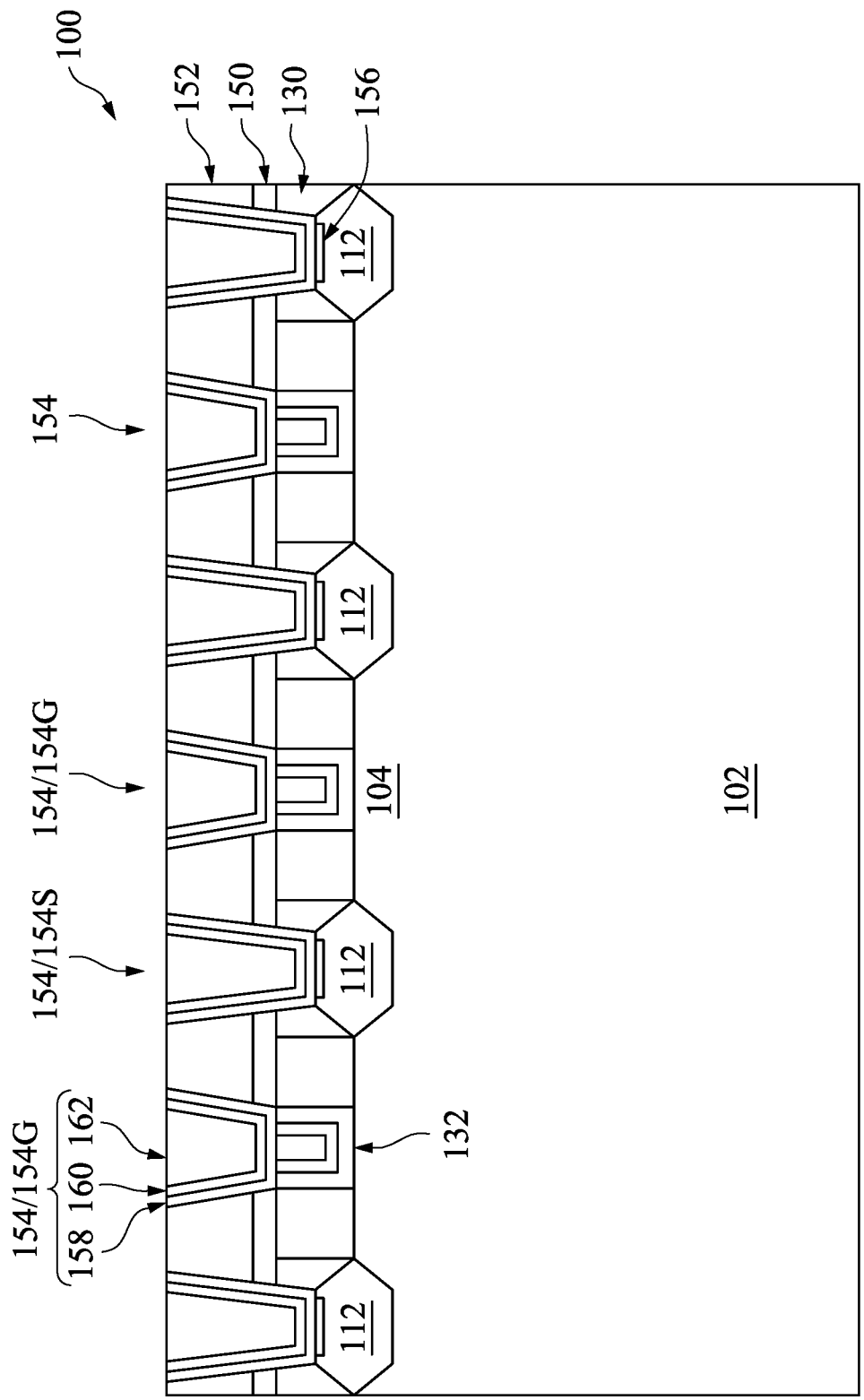
FIG. 17A illustrates a cross-sectional view along cross-section D-D of FIG. 15A, in accordance with some embodiments.
Figure 17B:
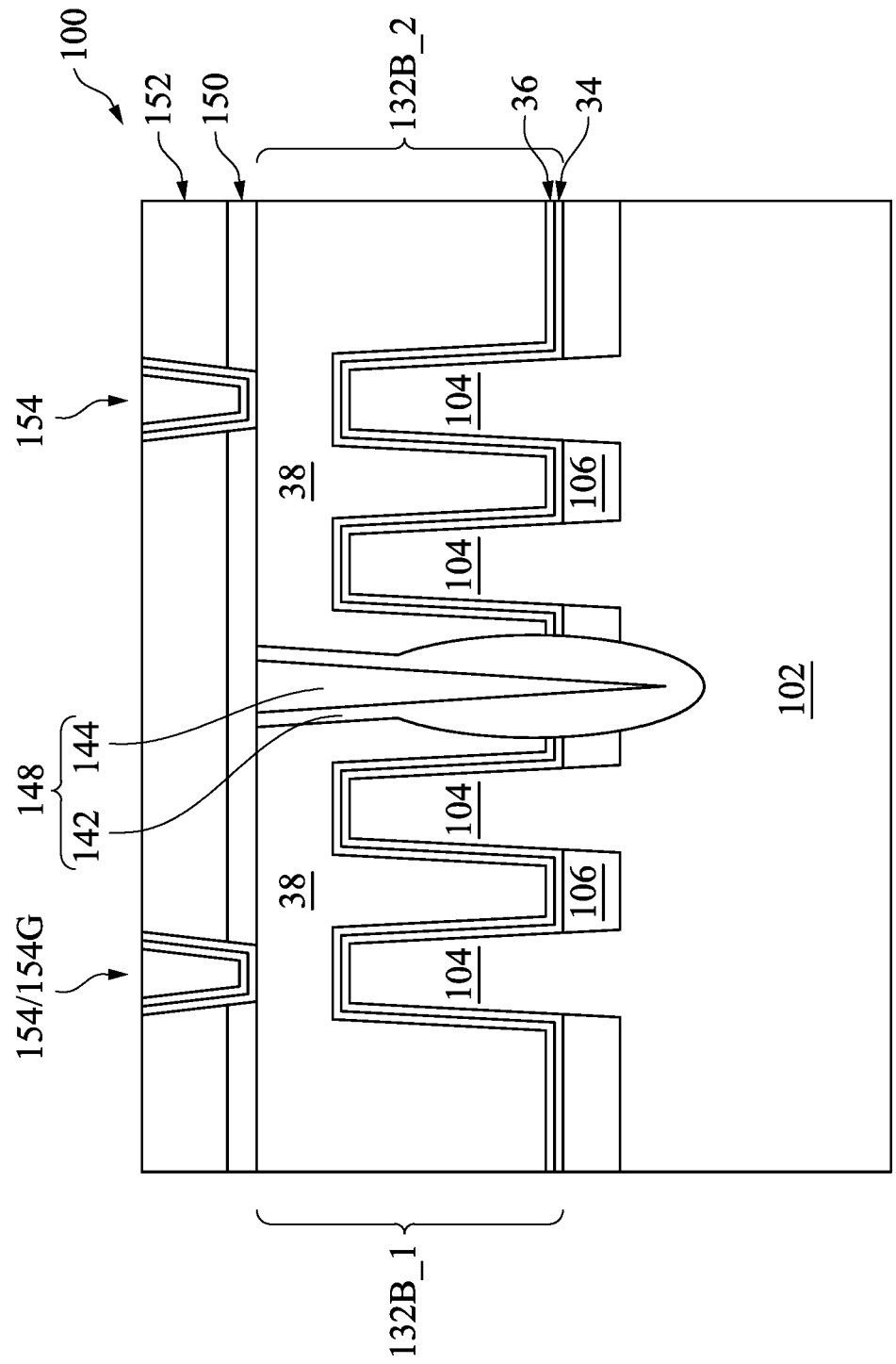
FIG. 17B illustrates a cross-sectional view along cross-section B-B of FIG. 15A, in accordance with some embodiments.

FIGS. 2-4, 5A-5C, 6A-6C, 7A-7D, 8A-8D, 10-12, 13A-13C, 14A-14C, 15A-15D, 16A-16C, and 17A-17B illustrate various views of a FinFET device 100 at various stages of fabrication, in accordance with an embodiment. The FinFET device 100 is similar to the FinFET 10 in FIG. 1, but with multiple fins and multiple gate structures. FIGS. 2-4 illustrate cross-sectional views of the FinFET device 100 along cross-section B-B. FIG. 5A illustrates a cross-sectional view of the FinFET device 100 along cross-section A-A, FIG. 5B illustrates a cross-sectional view along cross-section B-B, and FIG. 5C illustrates a cross-sectional view along cross-section C-C. FIG. 6A illustrates a cross-sectional view of the FinFET device 100 along cross-section A-A, and FIGS. 6B and 6C illustrate cross-sectional views along cross-section C-C. FIG. 7A illustrates a cross-sectional view of the FinFET device 100 along cross-section A-A, FIG. 7B illustrates a plan view of the FinFET device 100, FIG. 7C illustrates a cross-sectional view along cross-section B-B, and FIG. 7D illustrates a cross-sectional view along cross-section C-C in FIG. 7A. FIG. 8A illustrates a plan view of the FinFET 100, FIG. 8B illustrates a cross-sectional view of the FinFET 100 along cross-section B-B of FIG. 8A, FIG. 8C illustrates a cross-sectional view of the FinFET 100 along cross-section C-C of FIG. 8A, and FIG. 8D illustrates a cross-sectional view of the FinFET 100 along cross-section A-A of FIG. 8A. FIGS. 10-12, 13A, and 14A illustrate cross-sectional views along cross-section B-B. FIGS. 13B and 14B illustrate cross-sectional views along cross-section A-A of FIG. 8A. FIGS. 13C and 14C illustrate cross-sectional views along cross-section A-A. FIG. 15A illustrates a plan view of the FinFET 100, FIG. 15B illustrates a cross-sectional view along cross-section B-B of FIG. 15A, FIG. 15C illustrates a cross-sectional view along cross-section C-C of FIG. 15A, and FIG. 15D illustrates a cross-sectional view along cross-section A-A of FIG. 15A. FIG. 16A illustrates a cross-sectional view along cross-section B-B. FIG. 16B illustrates a cross-sectional view along cross-section C-C. FIG. 16C illustrates a cross-sectional view along cross-section C-C of FIG. 15A. FIG. 17A illustrates a cross-sectional view along cross-section D-D of FIG. 15A. FIG. 17B illustrates a cross-sectional view along cross-section B-B of FIG. 15A.

FIG. 2 illustrates a cross-sectional view of a substrate 102. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Referring next to FIG. 3, the substrate 102 shown in FIG. 2 is patterned using, for example, photolithography and etching techniques. For example, a mask layer, such as a pad oxide layer 114 and an overlying pad nitride layer 116, is formed over the substrate 102. The pad oxide layer 114 may be a thin film comprising silicon oxide formed, for example, using a thermal oxidation process. The pad oxide layer 114 may act as an adhesion layer between the substrate 102 and the overlying pad nitride layer 116 and may act as an etch stop layer for etching the pad nitride layer 116. In some embodiments, the pad nitride layer 116 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 114 and pad nitride layer 116 to form a patterned mask 118, as illustrated in FIG. 3.

The patterned mask 118 is subsequently used to pattern exposed portions of the substrate 102 to form trenches 120, thereby defining semiconductor fins 104 (may also be referred to as fins) between adjacent trenches 120 as illustrated in FIG. 3. In some embodiments, the semiconductor fins 104 are formed by etching trenches in the substrate 102 using, for example, reactive ion etch (RIE), neutral beam etch (NBE), the like, or a combination thereof. The etch may be anisotropic. In some embodiments, the trenches 120 may be strips (viewed from in the top) parallel to each other, and closely spaced with respect to each other. In some embodiments, the trenches 120 may be continuous and surround the semiconductor fins 104. After semiconductor fins 104 are formed, the patterned mask 118 may be removed by etching or any suitable method.

The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Next, FIG. 4 illustrates the formation of an insulation material between neighboring semiconductor fins 104 to form isolation regions 106. The insulation material may be an oxide (e.g., silicon oxide), a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed after the insulation material is formed. A planarization process, such as a chemical mechanical polish (CMP), may remove any excess insulation material (and, if present, the patterned mask 118) and form top surfaces of the isolation regions 106 and top surfaces of the semiconductor fins 104 that are coplanar (not shown).

In some embodiments, the isolation regions 106 include a liner, e.g., a liner oxide (not shown), at the interface between the isolation region 106 and the substrate 102/semiconductor fins 104. In some embodiments, the liner oxide is formed to reduce crystalline defects at the interface between the substrate 102 and the isolation region 106. Similarly, the liner oxide may also be used to reduce crystalline defects at the interface between the semiconductor fins 104 and the isolation region 106. The liner oxide (e.g., silicon oxide) may be a thermal oxide formed through a thermal oxidation of a surface layer of substrate 102, although other suitable method may also be used to form the liner oxide.

Next, the isolation regions 106 are recessed to form shallow trench isolation (STI) regions. The isolation regions 106 are recessed such that the upper portions of the semiconductor fins 104 protrude from between neighboring isolation regions 106. The top surfaces of the isolation regions 106 may have a flat surface (as illustrated), a convex surface, a concave surface (such as dishing), or a combination thereof. The top surfaces of the isolation regions 106 may be formed flat, convex, and/or concave by an appropriate etch. The isolation regions 106 may be recessed using an acceptable etching process, such as one that is selective to the material of the isolation regions 106. For example, a chemical oxide removal using dilute hydrofluoric (dHF) acid may be used.

FIGS. 2 through 4 illustrate an embodiment of forming fins 104, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor fins can be recessed, and a material different from the semiconductor fins may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

FIGS. 5A-5C illustrates formation of dummy gate structures 122 over the semiconductor fins 104. The dummy gate structures 122 each include gate dielectric 108 and gate 110, in some embodiments. The dummy gate structure 122 may be formed by patterning a mask layer, a gate layer and a gate dielectric layer, where the mask layer, the gate layer and the gate dielectric layer comprise a same material as the mask 121, the gate 110, and the gate dielectric 108, respectively. To form the dummy gate structures 122, the gate dielectric layer is formed on the semiconductor fins 104 and the isolation regions 106. The gate dielectric layer may be, for example, silicon oxide, silicon nitride, multilayers thereof, or the like, and may be deposited or thermally grown according to acceptable techniques. The formation methods of the gate dielectric layer may include molecular-beam deposition (MBD), atomic layer deposition (ALD), plasma-enhanced CVD (PECVD), and the like.

The gate layer is formed over the gate dielectric layer, and the mask layer is formed over the gate layer. The gate layer may be deposited over the gate dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the gate dielectric layer, the gate layer, and the mask layer are formed, the mask layer may be patterned using acceptable photolithography and etching techniques to form mask 121. The pattern of the mask 121 may then be transferred to the gate layer and the gate dielectric layer by a suitable etching technique to form gates 110 and gate dielectrics 108, respectively. Each gate 110 and a corresponding gate dielectric 108 collectively serve as a dummy gate structure 122 that wrap around channel regions of the semiconductor fins 104. The gate 110 may also have a lengthwise direction substantially perpendicular to the lengthwise direction of respective semiconductor fins 104.

Still referring to FIGS. 5A-5C, after forming the dummy gate structures 122, gate spacers 126 are formed on opposing sidewalls of the gate structures 122, and fin spacers 128 are formed on opposing sidewalls of the fins 104. In some embodiments, the spacers 126 and 128 are formed in same processing. For example, a spacer material layer is first deposited as a blanket layer over the substrate, and then the spacer material layer is anisotropically etched, such that horizontal portions of the spacer material layer are removed, while leaving portions of the spacer material layer on respective sidewalls of the dummy gate structures 122 and respective sidewalls of the fins 104. The remaining portions of the spacer material layer on sidewalls of the dummy gate structures 122 are denoted as gate spacers 126 as illustrated in FIG. 5A, and the remaining portions of the spacer material layer on sidewalls of the fins 104 are denoted as fin spacers 128 as illustrated in FIG. 5B.

The gate spacers 126 and fin spacers 128 may be formed of a nitride (e.g., silicon nitride), silicon oxynitride, silicon carbide, silicon carbonitride, the like, or a combination thereof, and may be deposited using, e.g., CVD, ALD or other suitable deposition processes. In some embodiments where the spacer material layer includes silicon nitride, the patterning of the silicon nitride layer includes a dry etching using $CH_2F_2$ as an etchant. In other embodiments in which the spacer material layer includes a silicon oxide layer and a silicon nitride layer, the patterning of the spacer material layer includes a dry etching using $CH_2F_2$ as an etchant to pattern silicon nitride, followed by a dry etching using $CF_4$ as an etchant to pattern the silicon oxide layer. The patterning includes an anisotropic effect, so that the horizontal portions of the spacer material layer are removed, while some vertical portions on the sidewalls of the dummy gate structures 122 remain to form gate spacers 126, and some vertical portions of the spacer material layer on the sidewalls of fins 104 remain to form fin spacers 128. In some embodiments, the process conditions for etching the spacer material layer are controlled to allow top ends of the fins 104 higher than top ends of the fins spacers 128.

FIG. 6A illustrates the cross-section view the FinFET device 100 along cross-section A-A (e.g., along a longitudinal axis of the fin) in a fabrication stage following the processing of FIGS. 5A-5C. As illustrated in FIG. 6A, source/drain regions 112 are formed on exposed portions of the fins that are not covered by the dummy gate structures 122 and gate spacers 126. In some embodiments, formation of the source/drain regions 112 includes etching exposed portions of the fins 104 to form recesses in the fins, followed by epitaxially growing semiconductor materials in the recesses of the fins 104.

The exposed portions of the fins 104 can be recessed using suitable selective etching processing that attacks the semiconductor fin 104, but hardly attacks the gate spacers 126, fin spacers 128, and the top masks 121 of the dummy gate structures 122. For example, recessing the semiconductor fins 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 104 at a faster etch rate than it etches the gate spacers 126, fin spacers 128, and the top masks 121 of the dummy gate structures 122. In some other embodiments, recessing the semiconductor fins 104 may be performed by a wet chemical etch, such as ammonium peroxide mixture (APM), $NH_4OH$, tetramethylammonium hydroxide (TMAH), combinations thereof, or the like, which etches the semiconductor fins 104 at a faster etch rate than it etches the gate spacers 126, fin spacers 128, and the top masks 121 of the dummy gate structures 122. In some other embodiments, recessing the semiconductor fins 104 may be performed by a combination of a dry chemical etch and a wet chemical etch.

Once recesses are created in the exposed regions of the fins 104, epitaxial structures 112 are formed in the source/drain recesses in the fins 104 to serve as source/drain regions 112 of transistors, by using one or more epitaxy or epitaxial (epi) processes that provides one or more epitaxial materials on the semiconductor fins 104. During the epitaxial growth process, the gate spacers 126 and fin spacers 128 limit the one or more epitaxial materials to exposed regions in the fins 104. As illustrated in FIG. 6A, the epitaxial source/drain regions 112 may have surfaces raised from respective surfaces of the fins 104 (e.g. raised above the non-recessed portions of the fins 104) and may have facets. In some embodiments, the source/drain regions 112 epitaxially grown on adjacent fins 104 do not merge together and remain separate source/drain regions 112, as illustrated in FIG. 6B. In some other embodiments, the source/drain regions 112 epitaxially grown on the adjacent fins 104 may merge to form a continuous epitaxial source/drain region 112, as illustrated in FIG. 6C.

In some embodiments, as illustrated in FIGS. 6B and 6C, the epitaxial material may be confined by the fin recess between corresponding fin spacers 128 and thus may have straight vertical or sloping sidewalls in between the fin spacers 128. Once the epitaxial material is grown to above the fin spacers 128, the epitaxial material will not be limited by the fin spacers 128 and thus form facets to have diamond shape. As a result, when viewed in a cross-sectional view taken along a direction perpendicular to longitudinal axes of fins 104 (e.g., FIG. 6B or 6C), each source/drain region 112 grown from a fin 104 has a lower portion 112l confined between a corresponding pair of fin spacers 128, and an upper portion 112u free of confinement by the corresponding pair of fin spacers 128. The upper portion 112u has a different cross-sectional profile than the lower portion 112l. In particular, the upper portion 112u of each source/drain region 112 has a diamond cross-sectional profile, and the lower portion 112l of each source/drain region 112 has a rectangular cross-sectional profile or a trapezoidal cross-sectional profile.

In some embodiments, the lattice constants of the epitaxy material of source/drain regions 112 are different from the lattice constant of the semiconductor fins 104, so that the channel regions in the fins 104 and between the source/drain regions 112 can be strained or stressed by the epitaxial material to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 104.

In some embodiments, the source/drain regions 112 may include Ge, Si, GaAs, AlGaAs, SiGe, GaAsP, SiP, or other suitable material. The source/drain regions 112 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 112 are not in-situ doped, an implantation process (i.e., a junction implant process) is performed to dope the source/drain epitaxial structures 112. In some exemplary embodiments, the source/drain epitaxial structures 112 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain regions 112 are formed, an annealing process can be performed to activate the p-type dopants or n-type dopants in the source/drain regions 112. The annealing process may be, for example, a rapid thermal anneal (RTA), a laser anneal, a millisecond thermal annealing (MSA) process or the like.

Next, as illustrated in FIG. 7A, a first interlayer dielectric (ILD) 130 is formed over the structure illustrated in FIG. 6A, and a gate-last process (sometimes referred to as replacement gate process) is performed. In a gate-last process, the gate 110 and the gate dielectric 108 (see FIG. 6A), which are considered dummy gate and dummy gate dielectric, respectively, are removed and replaced with an active gate and an active gate dielectric, which may be collectively referred to as a replacement gate.

In some embodiments, the first ILD 130 is formed of a dielectric material such as silicon oxide ($SiO_2$), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as CMP, may be performed to remove the mask 121 and to planarize the top surface of the first ILD 130, such that the top surface of the first ILD 130 is level with the top surface of the gate 110 after the CMP process. Therefore, after the CMP process, the top surface of the gate 110 is exposed, in the illustrated embodiments.

In accordance with some embodiments, the gate 110 and the gate dielectric 108 directly under the gate 110 are removed in an etching step(s), so that gate trenches each are formed between a corresponding pair of gate spacers 126. Each gate trench exposes a channel region of a respective fin 104. Each channel region may be disposed between neighboring pairs of epitaxial source/drain regions 112. During the dummy gate removal, the dummy gate dielectric layer 108 may be used as an etch stop layer when the dummy gate 110 is etched. The dummy gate dielectric layer 108 may then be removed after the removal of the dummy gate 110.

Next, replacement gate structures 132 are formed in respective gate trenches. The replacement gate structures 132 may be the final gates of FinFETs. The final gate structures each may be a high-k/metal gate stack, however other compositions are possible. In some embodiments, each of the replacement gate structures 132 forms the gate associated with the three-sides of a channel region provided by the fins 104. Stated another way, each of the replacement gate structures 132 wraps around channel regions of the fins 104 on three sides.

High-k/metal gate structures 132 are formed in the gate trenches by forming a gate dielectric layer 34, a work function metal layer 36, and a gate electrode 38 successively in each of the gate trenches. As illustrated in FIG. 7A, the gate dielectric layer 34 is deposited conformally in the gate trenches. The work function metal layer 36 is formed conformally over the gate dielectric layer 34, and the gate electrode 38 fills the recesses. The gate dielectric layer 34 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 36 and/or gate electrode 38 used within high-k/metal gate structures 132 may include a metal, metal alloy, or metal silicide. Formation of the high-k/metal gate structures 132 may include multiple deposition processes to form various gate materials, one or more liner layers, followed by one or more CMP processes to remove excessive gate materials. After the one or more CMP processes are complete, gate materials remain in the gate trenches to serve as high-k/metal gate structures 132.

In some embodiments, the interfacial layer of the gate dielectric layer 34 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 34 may include hafnium oxide ($HfO_2$). Alternatively, the gate dielectric layer 34 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 36 may include work function metals to provide a suitable work function for the high-k/metal gate structures 132. For an n-type FinFET, the work function metal layer 36 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 3 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the gate electrode 38 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Three metal gate structures 132 (e.g., 132A, 132B, and 132C) are illustrated in the example of FIG. 7A. However, more or less than three metal gate structures 132 may be used to form the FinFET device 100, as skilled artisans readily appreciate.

FIG. 7B illustrates a plan view of the FinFET device 100 of FIG. 7A. For simplicity, not all features of the FinFET device 100 are illustrated. For example, the gate spacers 126, the fin spacers 128, the isolation regions 106, and the source/drain regions 112 are not illustrated in FIG. 7B. As illustrated in FIG. 7B, the metal gate structures 132 (e.g., 132A/132B/132C) straddle the semiconductor fins 104 (e.g., 104A/104B/104C/104D). In subsequent processing, a metal gate cutting process (also called cut metal gate (CMG) process) is performed to break the continuous metal gate structure 132B into two separate metal gate structures 132B_1 and 132B_2 (see, e.g., FIG. 8A). In the illustrated embodiment, a portion of the metal gate structure 132B in a cut area 140 is removed, thereby separating the continuous metal gate structure 132B into two separate metal gate structures. In the illustrated embodiment, after the metal gate cutting process, a portion of the metal gate structure 132B over the semiconductor fins 104A and 104B form a first metal gate structure 132B_1 (see, e.g., FIG. 8A), and another portion of the metal gate structure 132B over the semiconductor fins 104C and 104D form a second metal gate structure 132B_2 (see, e.g., FIG. 8A). The first metal gate structure and the second metal gate structure may be controlled independently, e.g., by applying different control voltages to the first metal gate structure and the second metal gate structure by using individual gate contacts.

FIG. 7B illustrates a non-limiting example of the cut area 140. The number of cut areas 140, the size of cut areas 140, and the location of cut areas 140 may be varied to achieve different cutting patterns and to from metal gates with different sizes and patterns. For example, the cut area 140 may be enlarged along cross-section C-C to cut the metal gate structure 132A and/or the metal gate structure 132C in one step with the metal gate structure 132B. As another example, a second cut area may be used along cross-section B-B, e.g., between semiconductor fins 104A and 104B, to cut the metal gate structures 132B into three separate metal gate structures that can be controlled independently from each other. These and other variations of the cut areas 140 are fully intended to be included within the scope of the present disclosure. Discussions below use the example of one cut area 140 as illustrated in FIG. 7B, with the understanding that any number of cut areas may be used in the fabrication of the FinFET device 100.

FIGS. 7C and 7D illustrate cross-sectional views of the FinFET device 100 of FIG. 7A, but along cross-section B-B and C-C of FIG. 7A, respectively. As illustrated in FIG. 7D, the metal gate structures 132 extend over the isolation regions 106 and the substrate 102. Gate spacers 126 are on opposing sidewalls of each metal gate structure 132. The first ILD 130 laterally surrounds the metal gate structures 132 and the gate spacers 126. Since the cross-section C-C is outside the semiconductor fins 104, features such as the semiconductor fins 104, the fin spacers 128, the source/drain regions 112, are not visible in the cross-sectional view of FIG. 7D.

Next, in FIGS. 8A-8D, a metal gate cutting process (also called CMG process) is carried out to break the continuous metal gate 132B into separate metal gate structures 132B_1 and 132B_2. The metal gate structure 132B_1 extends across the fins 104A and 104B. The metal gate structure 132B_2 extends across the fins 104C and 104D. The metal gate structures 132B_1 and 132B_2 are separated by a CMG opening 141, and thus the metal gate structures 132B_1 and 132B_2 are electrically insulated and can be controlled independently.

In some embodiments, a first hard mask layer 123 and a second hard mask layer 124 are formed successively over the first ILD 130 and the metal gate structures 132, prior to forming the CMG opening 141. In some embodiments, the first hard mask layer 123 is a metal hard mask layer and the second hard mask layer 124 is a dielectric hard mask layer. In subsequent processing, a pattern is transferred onto the first hard mask layer 123 using various photolithography and etching techniques. The first hard mask layer 123 may then be used as an etching mask for etching the underlying structure (e.g., metal gate structure 132B). The first hard mask layer 123 may be a masking material such as titanium nitride, titanium oxide, the like, or a combination thereof. The first hard mask layer 123 may be formed using a process such as ALD, CVD, PVD, the like, or a combination thereof.

The second hard mask layer 124 is deposited over the first hard mask layer 123. The second hard mask layer 124 may be used as a masking pattern for the first hard mask layer 123. In subsequent processing steps, the second hard mask layer 124 is patterned to form patterns which may then be transferred to the first hard mask layer 123. The second hard mask layer 124 may be a masking material such as silicon nitride, silicon oxide, tetraethyl orthosilicate (TEOS), SiOxCy, the like, or a combination thereof. The second hard mask layer 124 may be formed using a process such as CVD, ALD, the like, or a combination thereof. In an example embodiment, the first hard mask layer 123 comprises titanium nitride, and the second hard mask layer 124 comprises silicon nitride.

Next, a patterned photoresist layer is formed over the first hard mask layer 123 and the second hard mask layer 124. A pattern (e.g., opening) in the patterned photoresist layer corresponds to the location of the CMG opening 141. The pattern in the photoresist layer is transferred to the first hard mask layer 123 and the second hard mask layer 124 using suitable methods, such as one or more anisotropic etching processes. As a result, a pattern (e.g., opening) is formed in the first hard mask layer 123 and the second hard mask layer 124, which pattern exposes a portion of the metal gate structure 132B within the cut area 140 (see FIG. 7B).

After patterning the first and second hard mask layers 123 and 124, a portion of the metal gate structure 132B within the cut area 140 (see FIG. 7B) and exposed by the patterned first and second hard mask layers 123 and 124 is removed. A suitable etching process, such as an anisotropic etching process, may be performed to remove the exposed portion of the metal gate structure 132B. After the portion of the metal gate structure 132B within the cut area 140 is removed, a CMG opening 141 is thus formed. The CMG opening 141 extends vertically through the metal gate structure 132B, and separates the metal gate 132B into two separate gate structures 132B_1 and 132B_2. In the illustrated example, the CMG opening 141 extends into the isolation region 106, and a bottom of the opening 141 further extends into the substrate 102.

In some embodiments, one or more etching conditions are selected to form a target profile for the CMG opening 141. The one or more etching conditions include total pressure of etch gas(es), radio frequency (RF) bias voltage, RF bias power, the like or combinations thereof. As a result of the etching control, the CMG opening 141 has a bowling-like profile when viewed in a cross-sectional view taken along longitudinal axes of metal gate structures 132 (e.g., FIGS. 8B and 8C). In particular, as illustrated in FIG. 8C, the CMG opening 141 has a lower profile 141l, an upper profile 141u above the lower profile 141l, and a neck 141n connecting the lower profile 141l and the upper profile 141u. The upper profile 141u of the CMG opening 141 has opposing linear sidewalls, and a distance between the linear sidewalls decreases from a top of the upper profile 141u to a bottom of the upper profile 141u (i.e., neck 141n of the CMG opening 141), and hence the upper profile 141u has an inverted trapezoidal shape. The lower profile 141l of the CMG opening 141 has opposing non-linear sidewalls, and a distance between the non-linear sidewalls increases from a top of the lower profile 141l (i.e., neck 141n of the CMG opening 141) to an intermediate level of the lower profile 141l and then decreases from the intermediate level of the lower profile 141l to a bottom of the lower profile 141l. In some embodiments, the non-linear sidewalls of the lower profile 141l are opposing convex sidewalls, and thus the lower profile 141l has an oval shape.

The neck 141n of the CMG opening 141 has a width smaller than a maximal width of the upper profile 141u and also smaller than a maximal width of the lower profile 141l. In some embodiments, the neck 141n is in the vicinity of a widest portion 112w of source/drain regions 112. Because of the small width of the neck 141n in the vicinity of the widest portion 112w of source/drain regions 112, the etching process for forming the CMG opening 141 will not cause unwanted damage to the source/drain regions 112. Moreover, because of an increased width of the lower profile 141l of the CMG opening 141, the electrical isolation of a gate isolation plug subsequently formed in the CMG opening 141 can be improved even if the gate isolation plug has a necking profile inheriting the necking profile of CMG opening 141.

In some embodiments, the cross-sectional profile of the CMG opening 141 in the cross-section B-B or C-C (as illustrated in FIG. 8B or 8C) is different from the cross-sectional profile of the CMG opening 141 in the cross-section A-A (as illustrated in FIG. 8D) that extends along a direction parallel with longitudinal axes of the fins 104. This is because the gate spacers 126 (e.g., nitride spacers) may have a higher etch resistance to the CMG etching process than that of the metal gates 132B and the first ILD 130. Because of the high etch resistance of the gate spacers 126, the gate spacers 126 may limit the profile of the CMG opening 141, and thus the CMG opening 141 has a rectangular cross-sectional profile in between the gate spacers 126 as illustrated in FIG. 8D. Moreover, the CMG opening 141 may have an oval shape in the substrate 102 in the cross-section A-A, similar to that in the cross-section B-B or C-C. As a result, in the cross-section A-A, the CMG opening 141 has a rectangular profile and an oval profile below the rectangular profile.

Next, a bi-layer isolation structure is formed in the CMG opening 141. Because the CMG opening 141 has a bowling-like cross-sectional profile, the neck 141n of the bowling-like CMG opening 141 with a narrowed width may cause increased challenge in depositing materials of the bi-layer isolation structure, which in turn may cause unfilled gaps or voids in the bi-layer isolation structure, which in turn may degrade electrical isolation property for the bi-layer isolation structure. Thus, the present disclosure provides, in various embodiments, an improved deposition process for forming the bi-layer isolation structure. In particular, a first dielectric layer of the bi-layer isolation structure can be formed by using an ALD process with an additional plasma treatment, so as to form a non-conformal layer with a thinner thickness within the upper profile 141u of the CMG opening 141 and a thicker thickness within the lower profile 141l of the CMG opening 141. Such a non-conformal layer can provide an improved deposition window for depositing a second dielectric layer of the bi-layer isolation structure, which in turn prevents unfilled gaps or voids in the second dielectric layer, thereby improving electrical isolation property.

Figure 9:
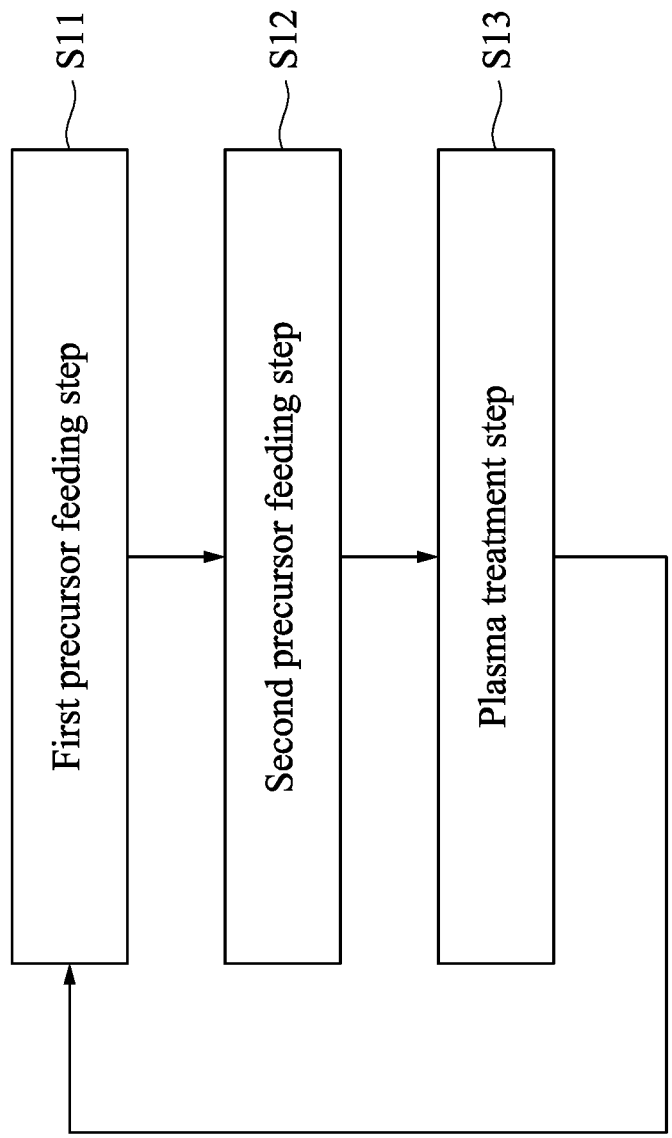
FIG. 9 is a flow chart of depositing a first dielectric layer of a bi-layer isolation structure, in accordance with some embodiments of the present disclosure.

FIG. 9 is a flow chart of depositing a first dielectric layer of the bi-layer isolation structure, in accordance with some embodiments of the present disclosure. FIG. 9 illustrates steps of an ALD process with an additional plasma treatment step. In some embodiments, the ALD process is a plasma-enhanced atomic layer deposition (PEALD) process. Note that while PEALD processes in general are used to form conformal layers, the disclosed embodiments herein uses a combination of a PEALD process and a plasma treatment to form a non-conformal dielectric layer 142, as illustrated in FIGS. 13A-13C. In some embodiments, a single wafer comprising a plurality of the FinFET devices 100 as illustrated in FIGS. 8A-8D is positioned in the processing chamber for the PEALD process. In other words, only one wafer is processed each time in the processing chamber by the disclosed PEALD process. In some embodiments, one or more wafers, where each wafer comprises a plurality of the FinFET devices 100 as illustrated in FIGS. 8A-8D, are positioned in the processing chamber for the PEALD process.

The deposition process as illustrated in FIG. 9 is a cyclic process including one or more repetitions of a deposition cycle to monolayers of a binary compound, such as silicon nitride. Each deposition cycle includes a first precursor feeding step S11, followed by a second precursor feeding step S12, and followed by a plasma treatment step S13. The deposition process may form a non-conformal binary compound layer such as silicon nitride, however other compositions are possible.

In some embodiments where the non-conformal layer is silicon nitride, in the first precursor feeding step S11 of each processing cycle, a halogen-containing silane precursor is fed into the processing chamber. The halogen-containing silane includes a compound having the general formula $Si_aH_bX_c$, where X is a halogen, a is 1-5, c is at least one and the sum of b and c equals 2a+2. In some embodiments, the halogen-containing silane precursor is diiodosilane ($SiH_2I_2$), dichlorosilane ($SiH_2Cl_2$), or other suitable silane. The halogen-containing silane precursor may be carried into the processing chamber by a carrier gas, such as nitrogen ($N_2$). A flow rate of the first precursor and the carrier gas may be between about 3 standard liter per minute (slm) and about 50 slm, and the halogen-containing silane precursor and the carrier gas may be fed into the processing chamber for about 0.1 second to about 10 second. The volume mixing ratio for the halogen-containing silane precursor (e.g., $SiH_2I_2$ or $SiH_2Cl_2$) and $N_2$ may be between about 0.01 and about 0.5. A temperature for the first precursor feeding step S11 may be between about 250° C. and about 500° C., and a pressure for the first precursor feeding step S11 may be between about 0.1 torr and about 40 torr.

In some embodiments, after the first precursor feeding step S11 is finished and before the second precursor feeding step S12 starts, un-used (e.g., un-reacted) silane-based precursor and by-products of the first step are pumped out of the processing chamber.

Figure 10:
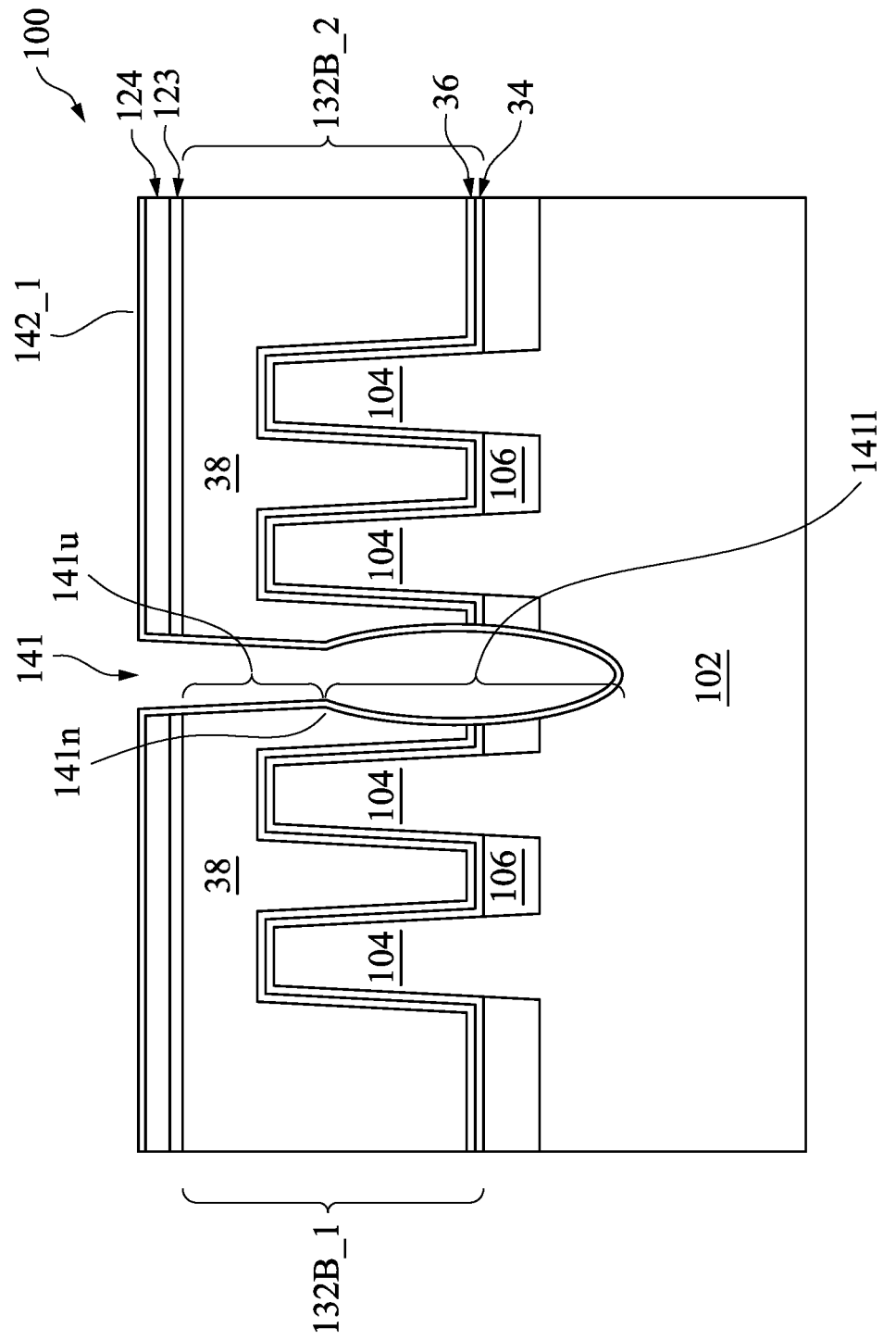
FIGS. 10-12, 13A, and 14A illustrate cross-sectional views along cross-section B-B of FIG. 1, in accordance with some embodiments.

Next, in the second precursor feeding step S12, a nitrogen-containing precursor, such as a plasma of $NH_3$ or plasmas of $N_2$ and $H_2$, is fed into the processing chamber to trigger an ALD reaction. In particular, the nitrogen-containing precursor reacts with the halogen-containing silane precursor to deposit a monolayer of silicon nitride on exposed surfaces of the structure illustrated in FIGS. 8A-8D. FIG. 10 illustrates a cross-sectional view of an example monolayer of silicon nitride 142_1 after the second precursor feeding step S12 is finished. As illustrated in FIG. 10, the first precursor feeding step S11 and the second precursor feeding step S12 in combination form a silicon nitride monolayer 142_1, which basically follows ALD nature to grow as a conformal layer having a uniform thickness throughout the CMG opening 141. In particular, the silicon nitride monolayer 142_1 is deposited at a same deposition rate throughout the CMG opening 141. Stated differently, the deposition rate variation in depositing the monolayer 142_1 among various locations of the CMG opening 141 is zero or negligibly small.

In some embodiments, after the second precursor feeding step S12 is finished and before the plasma treatment step S13 starts, un-used (e.g., un-reacted) nitrogen-containing precursor and by-products of the second step are pumped out of the processing chamber.

Figure 11:
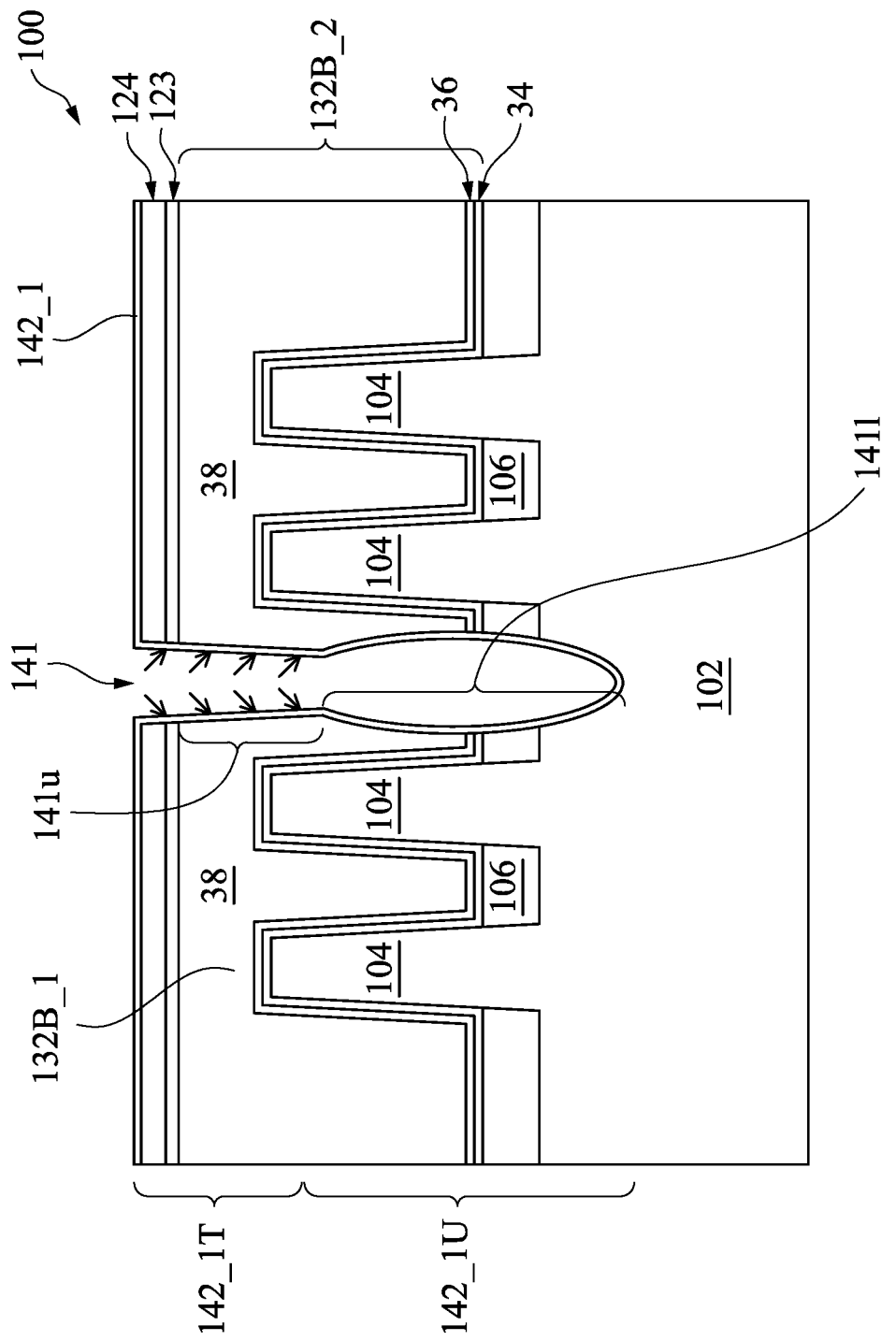

Next, in the plasma treatment step S13, the silicon nitride monolayer 142_1 is treated in a nitrogen-containing plasma, which in turn forms a treated region 142_1T in a portion of the silicon nitride monolayer 142_1, while leaving a another portion 142_1U untreated, as illustrated in FIG. 11. The plasma treatment step S13 may include an $N_2$ plasma treatment, wherein the nitrogen-containing gas is conducted into a process chamber, in which the plasma is generated from the oxygen-containing gas. By way of example and not limitation, the semiconductor substrate 102 having the structure illustrated in FIG. 10 is loaded in to a plasma tool and exposed to a plasma environment generated by oxygen ($N_2$) gas.

One or more process conditions of the $N_2$ plasma treatment are controlled in such a way that an upper portion of the silicon nitride monolayer 142_1 is treated as a treated region 142_1T, and a lower portion of the silicon nitride monolayer 142_1 remains as an untreated region 142_1U. The one or more process conditions for achieving such treated region 142_1T and untreated region 142_1U include, by way of example and not limitation, $N_2$ plasma treatment time duration, $N_2$ plasma treatment pressure, tilted angle of the $N_2$ plasma. For example, the $N_2$ plasma may be directed toward the substrate 102 at an angle tilted from a normal to the top surface of the substrate 102. A non-zero titled angle allows for exposing the upper portion of the silicon nitride monolayer 142_1 to a higher dose of plasma, while exposing the lower portion of the silicon nitride monolayer 142_1 to a lower dose of plasma, or even no or a negligible dose of plasma, thanks to shadowing effect resulting from the high aspect ratio of CMG opening 141 (i.e., ratio of CMG opening depth to CMG opening width). As a result, the $N_2$ plasma treatment with a controlled tilted angle allows for forming a treated region 142_1T and an untreated region 142_1U below the treated region 142_1T in the silicon nitride monolayer 142_1.

In some embodiments, nitrogen radicals generated from the $N_2$ plasma treatment can serve as an inhibitor to deactivate the treated region 142_1T of the silicon nitride monolayer 142_1, which in turn aids in inhibiting silicon nitride nucleation on the treated region 142_1T, which in turn decreases a deposition rate of silicon nitride on the treated region 142_1T in a next ALD cycle (i.e., the cycle including steps S11 and S12). As illustrated in FIG. 12, after the next ALD cycle is finished (repeating the steps S11 and S12 again), a next silicon nitride monolayer 142_2 deposited on the previously deposited silicon nitride monolayer 142_1 has a non-uniform thickness, which is different from the uniform thickness of the previously deposited silicon nitride monolayer 142_1.

In some embodiments, the silicon nitride monolayer 142_2 has an upper portion 142_2T deposited on the treated region 142_1T of the silicon nitride monolayer 142_1, and a lower portion 142_2U deposited on the untreated region 142_1U of the silicon nitride monolayer 142_1. Because the treated region 142_1T has a slower deposition rate than the untreated region 142_1U during depositing the silicon nitride monolayer 142_2, the resultant upper portion 142_2T of the silicon nitride monolayer 142_2 has a smaller thickness than the lower portion 142_2U of the silicon nitride monolayer 142_2. As discussed previously, the deposition rate variation among various locations of the CMG opening 141 in the first deposition cycle (i.e., the cycle of depositing the monolayer 142_1) is zero or negligibly small, and thus the deposition rate variation among various locations of the CMG opening 141 is greater in the second deposition cycle (e.g., the cycle of depositing the monolayer 142_2) than in the first deposition cycle.

After one or more repetitions of the deposition cycles including steps S11 to S13 is finished, a non-conformal first dielectric layer 142, comprising two or more silicon nitride monolayers (e.g., layers 142_1, 142_2), is formed in the CMG opening 141, as illustrated in FIGS. 13A-13C. The first dielectric layer 142 includes an upper portion 142T and a lower portion 142U below the upper portion 142T. The upper portion 142T has a smaller thickness than the lower portion 142U, because the upper portion 142T is growth at a slower film growth rate than the lower portion 142U, as discussed previously with respect to FIGS. 9-12. Stated differently, the first dielectric layer 142 is thinner within the upper profile 141u of the CMG opening 141 than within the lower profile 141l of the CMG opening 141, which in turn provides an improved deposition window for filling up the remaining portion of the CMG opening 141 in subsequent processing. In some embodiments, the first dielectric layer 142 has a V-shaped inner profile within the CMG opening 141. The V-shaped profile of the first dielectric layer 142 makes it easier to fill up the remaining portion of the CMG opening 141, comparing with the bowling-like profile having a narrowed neck. Therefore, the V-shaped profile of the first dielectric layer 142 provides an improved deposition window for filling up the CMG opening 141 in subsequent processing.

In some embodiments, as illustrated in FIGS. 13A and 13B, the upper portion 142T of the first dielectric layer 142 has a smaller thickness variation than the lower portion 142U. Stated differently, the thickness of the upper portion 142T is more uniform than the lower portion 142U. In some embodiments, the upper portion 142T has a lateral portion 142L laterally extending along a top surface of the hard mask layer 124. The lateral portion 142L has a smaller thickness than the lower portion 142U of the first dielectric layer 142. This is because the lateral portion 142L is also grown on a treated region of a silicon nitride monolayer and thus has a slower film growth rate than the lower portion 142U. In some embodiments, the lateral portion 142L of the first dielectric layer 142 has a smaller thickness variation than the lower portion 142U. Stated differently, the thickness of the lateral portion 142L is more uniform than the lower portion 142U.

In some embodiments, the upper portion 142T has linear outer sidewalls 142TS1 within the CMG opening 141 and forming linear interfaces with the metal gate structures 132B_1, 132_B2 respectively, and forming linear interfaces with the first ILD 130. The linear outer sidewalls 142TS1 are separated by a distance decreasing as the first dielectric layer 142 extends toward the substrate 102. In some embodiments, the lower portion 142U has non-linear outer sidewalls 142US1 within the CMG opening 141 and forming non-linear interfaces with the metal gate structures 132B_1, 132_B2 respectively, and forming non-linear interfaces with the first ILD 130, the isolation region 106 and the substrate 102. The non-linear outer sidewalls 142US1 are convex sidewalls, and a distance between the non-linear outer sidewalls 142US1 increases from a top of the lower portion 142U to an intermediate level of the lower portion 142U and then decreases from the intermediate level to a bottom of the lower portion 142U. In some embodiments, the upper portion 142T has linear inner sidewalls 142TS2 within the CMG opening 141, and the lower portion 142U has lower linear inner sidewalls 142TU2 aligned with the linear inner sidewalls 142TS2 of the upper portion 142T. These linear inner sidewalls collectively form the V-shaped inner profile of the first dielectric layer 142. In some embodiments, the outer surface profile of lower portion 142U is more cured than the outer surface profile of upper portion 142T Next, in FIGS. 14A-14C, a second dielectric layer 144 is formed over the first dielectric layer 142 and overfills the CMG opening 141. In the illustrated embodiments, the second dielectric layer 144 is formed of a dielectric material different from the dielectric material of the first dielectric layer 142, and the dielectric constant of the second dielectric layer 144 is smaller than that of the first dielectric layer 142. In some embodiments, the first dielectric layer 142 and the second dielectric layer 144 form a V-shaped cross-sectional profile within the CMG opening 141.

In some embodiments, the second dielectric layer 144 is formed of silicon oxide, and is formed by a PEALD process. The second dielectric layer 144 may be formed in a same processing chamber as that for the first dielectric layer 142, although different processing chamber may be used for forming the second dielectric layer 144. In some embodiments, a single wafer comprising a plurality of the FinFET devices 100 of FIGS. 13A-13C is positioned in the processing chamber for the PEALD process to form the second dielectric layer 144. In other words, only one wafer is processed each time in the processing chamber. In some embodiments, one or more wafers, where each wafer comprises a plurality of the FinFET devices 100 of FIGS. 13A-13C, are positioned in the processing chamber for the PEALD process.

In some embodiments, the PEALD process to form the second dielectric layer 144 includes multiple cycles, with each cycle having four processing steps, similar to the PEALD processing discussed above. The four processing steps includes a first step where a first precursor is supplied to the processing chamber, a second step to pump out gases in the processing chamber, a third step where a second precursor is supplied to the processing chamber, and a fourth step to pump out gases in the processing chamber.

In some embodiments, the first precursor for forming the second dielectric layer 144 (e.g., silicon oxide), such as N-(diethylaminosilyl)-N-ethylethanamine ($C_8H_{22}N_2Si$), is fed into the processing chamber in the first processing step. The first precursor may be carried into the processing chamber by a carrier gas, such as argon (Ar). A flow rate of the first precursor and the carrier gas may be between about 4 slm and about 20 slm, and the first precursor and the carrier gas may be fed into the processing chamber for about 0.2 second to about 8 second. The mixing ratio for the first precursor and the carrier gas may be between about 0.02 and about 0.08. A temperature for the first processing step may be about 200° C. to about 300° C., and a pressure for the first processing step may be between about 0 torr and about 30 torr.

In some embodiments, the second precursor for forming the second dielectric layer 144, such as a plasma of $O_2$, is fed into the processing chamber in the third processing step. In some embodiments, the second precursor is $O_2$ gas. A flow rate of the second precursor may be between about 0.8 slm and about 18 slm. A temperature for the third step may be between about 200° C. and about 300° C., and a pressure for the third step may be between about 0 torr and about 30 torr. The second precursor may be supplied for about 0.8 second to about 25 seconds. A power of the RF source for the PEALD process is between about 20 W and about 80 W, and the RF source is turned ON for about 0.5 minute to 2 minutes.

In the example discussed above, the first dielectric layer 142 (e.g., SiN) and the second dielectric layer 144 (e.g., $SiO_2$) form an isolation film stack 146 with a bi-layer structure. The isolation film stack 146 functions as a gap-filling isolation structure that separates the metal gate structure 132B into two separate metal gate structures 132B_1 and 132B-2. Because the second dielectric layer 144 (e.g., $SiO_2$) has a lower dielectric constant than the first dielectric constant 142 (e.g., SiN), the parasitic capacitance between the metal gate structures 132B_1 and 132B_2 can be can be reduced, which in turn reduces the RC delay of the FinFETs. In some embodiments, the second dielectric layer 144 may have a same material as the first dielectric layer 142. For example, the first dielectric layer 142 and the second dielectric layer 144 may be silicon nitride. In such embodiments, the second dielectric layer 144 may be formed by using the deposition process as illustrated in FIG. 9.

Besides the example materials discussed above, other suitable material(s) may be used in the film stack. For example, the second dielectric layer 144 may be formed of SiCN, SiOC, SiOCN, or the like. In some embodiments, the isolation film stack 146 includes more than two layers of dielectric materials. For example, the second dielectric layer 144 may be replaced by a plurality of dielectric layers (may also be referred to as a plurality of sublayers of dielectric materials) with a lower overall (e.g., average) dielectric constant than the first dielectric layer 142. The plurality of sublayers of dielectric materials may include layers of different materials, such as layers of SiCN, SiOC, SiOCN, or the like. The overall (e.g., average) dielectric constant value (i.e., K value) of the plurality of sublayers of dielectric materials in the second dielectric layer 144 is lower than the K value of the first dielectric layer 142. As an example, all of the dielectric materials in the plurality of sublayers of dielectric materials have K values smaller than that of the first dielectric layer 142. As another example, some sublayers of dielectric materials in the second dielectric layer 144 may have K values larger than the K value of the first dielectric layer 142, but the overall K value of all of the sublayers of dielectric materials is lower than the K value of the first dielectric layer 142 (e.g., due to other sublayers of dielectric material having lower K values than the first dielectric layer 142).

Next, in FIGS. 15A-15D, a planarization process, such as CMP, is performed to remove the first hard mask layer 123, the second hard mask layer 124, and portions of the dielectric layers 142 and 144 disposed over the upper surface of the gate electrodes 38, while leaving portions of the dielectric layers 142, 144 in the CMG opening 141 to serve as a gate isolation plug 148 between a longitudinal end of the metal gate structure 132B_1 and a longitudinal end of the metal gate structure 132B_2, as illustrated in FIG. 15A. As illustrated in cross-sectional views of FIGS. 15B-15D, the first dielectric layer 142 serves as a non-conformal liner lining sidewalls and a bottom of the second dielectric layer 144, which serves as a filling dielectric filling up the CMG opening 141. In the plan view as illustrated in FIG. 15A, the gate isolation plug 148 has a quadrilateral profile (e.g., square profile or rectangular profile). For example, in the plan view the second dielectric layer 144 has a rectangular pattern, and the first dielectric layer 142 has a rectangular ring-shaped pattern enclosing the rectangular pattern of the second dielectric layer 144.

In some embodiments, as illustrated in FIGS. 15B and 15C, the gate isolation plug 148 has a V-shaped inner interface formed between the dielectric layers 142 and 144, and has a bowling-like outer surface with a different shape than the V-shaped inner interface. In particular, the gate isolation plug 148 has an upper portion 148T and a lower portion 148U below the upper portion 148T. The upper portion 148T has linear outer sidewalls 148TS forming linear interfaces with the metal gate structures 132B_1, 132_B2 respectively, and forming linear interfaces with the first ILD 130. The linear outer sidewalls 148TS are separated by a distance decreasing as the gate isolation plug 148 extends toward the substrate 102. In some embodiments, the lower portion 148U has non-linear outer sidewalls 148US forming non-linear interfaces with the metal gate structures 132B_1, 132_B2 respectively, and forming non-linear interfaces with the first ILD 130, the isolation region 106 and the substrate 102. The non-linear outer sidewalls 148US are convex sidewalls, and a distance between the non-linear outer sidewalls 142US1 increases from a top of the lower portion 148U to an intermediate level of the lower portion 148U and then decreases from the intermediate level to a bottom of the lower portion 148U.

In FIGS. 16A-16C, a contact etch stop layer (CESL) 150 is formed over the metal gate structures 132 and the gate isolation plug 148, and a second ILD 152 is formed over the CESL 150. The CESL 150 may be formed by a PECVD process and/or other suitable deposition processes. In some embodiments, the CESL 150 is a silicon nitride layer and/or other suitable materials having a different etch selectivity than the second ILD 152. In some embodiments, the second ILD layer 152 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 150. In certain embodiments, the second ILD 152 is formed of silicon oxide ($SiO_x$). The second ILD 152 may be deposited by a PECVD process or other suitable deposition technique.

In FIGS. 17A and 17B, contacts 154 (e.g., gate contacts 154G and source/drain contacts 154S) are formed over and electrically coupled to the metal gate structures 132 or source/drain regions 112. To form the contacts 154, contact openings are formed through the second ILD 152, the CESL 150, and/or the first ILD 130 to expose the source/drain regions 112 and the metal gate structures 132, and the contact openings are then filled with electrically conductive material(s) to form the contacts 154. In some embodiments, silicide regions 156 are formed over the source/drain regions 112 before the contact openings are filled. Details of forming the contacts 154 are discussed hereinafter.

In some embodiments, silicide regions 156 are formed over the source/drain regions 112. Silicide regions 156 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 112, then performing a thermal anneal process to form the silicide regions 156. The unreacted portions of the deposited metal are then removed, e.g., by an etching process. Although regions 156 are referred to as silicide regions, regions 156 may also be germanide regions, or silicon germanide regions (e.g., regions comprising silicide and germanide).

Next, a barrier layer 158 is formed lining sidewalls and bottoms of the contact openings, over the silicide regions 156, and over the upper surface of the second ILD 152. The barrier layer 158 may comprise titanium nitride, tantalum nitride, titanium, tantalum, the like, and may be formed by ALD, PVD, CVD, or other suitable deposition method. Next, a seed layer 160 is formed over the barrier layer 158. The seed layer 160 may be deposited by PVD, ALD or CVD, and may be formed of tungsten, copper, or copper alloys, although other suitable methods and materials may alternatively be used. Once the seed layer 160 has been formed, a conductive material 162 may be formed on the seed layer 160, filling and overfilling the contact openings. The conductive material 162 may comprise tungsten, although other suitable materials such as aluminum, copper, tungsten nitride, ruthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 162.

Once the contact openings have been filled, excess portions of the barrier layer 158, seed layer 160, and conductive material 162 outside of the contact openings may be removed through a planarization process such as CMP, although any suitable removal process may be used. Contacts 154 are thus formed in the contact openings. The contacts 154 are illustrated in a single cross-section as an example, the contacts 154 could be in different cross-sections.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the liner layer of the gate isolation plug is thinner at top of the gate isolation plug than at bottom of the gate isolation plug, which in turn provides an improved deposition window for depositing a dielectric material into the remaining CMG opening. Another advantage is that unfilled gaps or voids can be prevented in the gate isolation plug, which in turn improves electrical isolation for the gate isolation plug.

In some embodiments, a method includes forming a semiconductor fin extending from a substrate, forming source/drain regions on the semiconductor fin, forming a gate structure extending across the semiconductor fin and between the source/drain regions, etching an opening in the gate structure, forming a first dielectric layer in the opening, and forming a second dielectric layer filling the opening. The first dielectric layer has a lower portion and an upper portion above the lower portion, and the upper portion is thinner than the lower portion.

In some embodiments, a method includes forming a first gate structure over a substrate, etching the first gate structure to break the gate structure into separate second gate structures, and forming a gate isolation plug between the second gate structures. The gate isolation plug comprises a filling dielectric and a dielectric liner lining sidewalls and a bottom of the filling dielectric. The dielectric liner and the filling dielectric form an interface having a cross-sectional profile different than a cross-sectional profile of an outer surface of the dielectric liner.

In some embodiments, a device includes first and second gate structures respectively extending across the first and second fins, and a gate isolation plug between a longitudinal end of the first gate structure and a longitudinal end of the second gate structure. The gate isolation plug comprises a first dielectric layer and a second dielectric layer over the first dielectric layer. The first dielectric layer has an upper portion and a lower portion below the upper portion. The upper portion has a thickness smaller than a thickness of the lower portion of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a semiconductor fin extending from a substrate;
forming source/drain regions on the semiconductor fin;
forming a gate structure extending across the semiconductor fin and between the source/drain regions;
etching an opening in the gate structure;
forming a first dielectric layer in the opening, wherein the first dielectric layer has a lower portion and an upper portion above the lower portion, and the upper portion is thinner than the lower portion, wherein forming the first dielectric layer comprises one or more repetitions of a deposition cycle, and the deposition cycle comprises first precursor feeding step, a second precursor feeding step after the first precursor feeding step, and a plasma treatment step after the second precursor feeding step; and
forming a second dielectric layer filling the opening.

2. The method of claim 1, wherein the plasma treatment step uses a nitrogen-containing plasma.

3. The method of claim 1, wherein in the plasma treatment step an upper portion of the opening is exposed to a first dose of plasma, and a lower portion of the opening is exposed to a second dose of plasma lower than the first dose of plasma.

4. The method of claim 1, wherein the one or more repetitions of the deposition cycle comprises a first deposition cycle and a second deposition cycle after the first deposition cycle, wherein a deposition rate variation among different locations of the opening is greater in the second deposition cycle than in the first deposition cycle.

5. The method of claim 4, wherein in the second deposition cycle a deposition rate at an upper portion of the opening is slower than a deposition rate at a lower portion of the opening.

6. The method of claim 4, wherein in the first deposition cycle a deposition rate at an upper portion of the opening is same as a deposition rate at a lower portion of the opening.

7. The method of claim 1, wherein the opening has a first profile and a second profile above the first profile, the first profile has non-linear sidewalls, and the second profile has linear sidewalls.

8. The method of claim 7, wherein the source/drain regions has a largest width at a level proximate to a neck connecting the first profile and the second profile of the opening.

9. The method of claim 7, wherein the non-linear sidewalls of the first profile are convex.

10. A method comprising:
forming a first gate structure over a substrate;
etching the first gate structure to break the first gate structure into separate second gate structures; and
forming a gate isolation plug between the second gate structures, wherein the gate isolation plug comprises a filling dielectric and a dielectric liner lining sidewalls and a bottom of the filling dielectric, wherein the dielectric liner and the filling dielectric form an interface having a cross-sectional profile different than a cross-sectional profile of an outer surface of the dielectric liner.

11. The method of claim 10, wherein the cross-sectional profile of the interface formed by the dielectric liner and the filling dielectric is V-shaped.

12. The method of claim 10, wherein the cross-sectional profile of the outer surface of the dielectric liner has an upper profile and a lower profile below the upper profile, and the lower profile is more curved than the upper profile.

13. The method of claim 10, wherein forming the dielectric liner comprises:
forming a monolayer of the dielectric liner using atomic layer deposition; and
treating the monolayer of the dielectric liner with a plasma.

14. The method of claim 13, wherein the plasma treating the monolayer of the dielectric liner is a nitrogen-containing plasma.

15. The method of claim 13, wherein after treating the monolayer of the dielectric liner with the plasma, the monolayer has a treated region and an untreated region below the treated region.

16. A device comprising:
a first gate structure extending across a first fin;
a second gate structure extending across a second fin; and
a gate isolation plug between a longitudinal end of the first gate structure and a longitudinal end of the second gate structure, wherein the gate isolation plug comprises a first dielectric layer and a second dielectric layer over the first dielectric layer, the first dielectric layer has an upper portion and a lower portion below the upper portion, and the upper portion has a thickness smaller than a thickness of the lower portion of the first dielectric layer, wherein the first dielectric layer and the second dielectric layer form an interface having a cross-sectional profile different than a cross-sectional profile of an outer surface of the first dielectric layer.

17. The device of claim 16, wherein the cross-sectional profile of the interface formed by the first dielectric layer and the second dielectric layer is V-shaped.

18. The device of claim 16, wherein the upper portion of the first dielectric layer has linear outer sidewalls, and the lower portion of the first dielectric layer has non-linear outer sidewalls.

19. The device of claim 16, further comprising a source/drain feature on the first fin, wherein the source/drain feature has a largest width at a level proximate to a neck connecting the upper portion and the lower portion of the first dielectric layer.

20. The device of claim 16, further comprising an isolation region disposed between the first fin and the second fin, wherein the gate isolation plug extends through the isolation region.

* * * * *